United States Patent
Wakabayashi et al.

(10) Patent No.: US 8,227,966 B2
(45) Date of Patent: Jul. 24, 2012

(54) SHEET AND LIGHT EMITTING APPARATUS

(75) Inventors: Shin-ichi Wakabayashi, Osaka (JP); Seiji Nishiwaki, Hyogo (JP); Masa-aki Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/057,297

(22) PCT Filed: Dec. 21, 2009

(86) PCT No.: PCT/JP2009/007063
§ 371 (c)(1),
(2), (4) Date: Feb. 3, 2011

(87) PCT Pub. No.: WO2010/073585
PCT Pub. Date: Jul. 1, 2010

(65) Prior Publication Data
US 2011/0133624 A1    Jun. 9, 2011

(30) Foreign Application Priority Data
Dec. 26, 2008   (JP) .................................. 2008-335001

(51) Int. Cl.
*H05B 33/00*    (2006.01)
*F21V 9/00*    (2006.01)
*H01J 5/16*    (2006.01)

(52) U.S. Cl. ................ 313/112; 313/506; 362/293
(58) Field of Classification Search .................. None
See application file for complete search history.

(56) References Cited

U.S. PATENT DOCUMENTS

| 6,236,439 | B1 | 5/2001 | Saiki et al. | |
| 7,982,396 | B2 * | 7/2011 | Cok | 313/506 |
| 2002/0180348 | A1 | 12/2002 | Oda et al. | |

(Continued)

FOREIGN PATENT DOCUMENTS

JP    63-314503 A    12/1988

(Continued)

OTHER PUBLICATIONS

International Search Report for corresponding International Application No. PCT/JP2009/007063 mailed Jan. 26, 2010.

(Continued)

*Primary Examiner* — Ashok Patel
(74) *Attorney, Agent, or Firm* — Renner, Otto, Boisselle & Sklar, LLP

(57) ABSTRACT

A sheet of the present invention is a sheet which is to be used such that light from a light emitting body impinges on one of surfaces of the sheet and outgoes from the other surface. The other surface of the sheet includes a plurality of minute regions 13, a largest inscribed circle of the minute regions 13 having a diameter from 0.2 μm to 2 μm. Each of the plurality of minute regions 13 is adjoined by and surrounded by some other ones of the plurality of minute regions 13. The plurality of minute regions 13 include a plurality of minute regions 13a which are randomly selected from the plurality of minute regions 13 so as to constitute 20% to 80% of the minute regions 13 and a plurality of minute regions 13b which constitute the remaining portion of the minute regions 13. Light transmitted through the plurality of minute regions 13a and light transmitted through the plurality of minute regions 13b have a phase difference of π.

10 Claims, 12 Drawing Sheets

U.S. PATENT DOCUMENTS

2003/0071935 A1    4/2003  Maeda
2009/0072731 A1*  3/2009  Adachi ........................ 313/504

FOREIGN PATENT DOCUMENTS

| | | |
|---|---|---|
| JP | 11-283751 | 10/1999 |
| JP | 2000-266936 A | 9/2000 |
| JP | 2001-059948 A | 3/2001 |
| JP | 2002-359068 A | 12/2002 |
| JP | 2004-273122 A | 9/2004 |
| JP | 2005-266188 A | 9/2005 |
| JP | 2008-276940 A | 11/2008 |

OTHER PUBLICATIONS

International Preliminary Report on Patentability for corresponding International Application No. PCT/JP2009/007063 dated Sep. 21, 2010.

\* cited by examiner (a)

(b)

(a)

(b)

(a)

(b)

(a)

(b)

SHEET AND LIGHT EMITTING APPARATUS

TECHNICAL FIELD

The present invention relates to a transparent sheet for use with a light emitting body with one of the surfaces of the sheet being adjacent to the light emitting body, and a light emitting device which includes the sheet.

BACKGROUND ART

FIG. 18 is a diagram showing a cross-sectional structure of a light emitting device employing a common organic electroluminescence element (organic EL element) and propagation of light. In the common organic EL element, an electrode 102, a light emitting layer 103, and a transparent electrode 104 are stacked in this order on a substrate 101, and a transparent substrate 105 is provided on the transparent electrode 104. When a voltage is applied between the electrode 102 and the transparent electrode 104, light is radiated from a point S in the light emitting layer 103. The light enters the transparent electrode 104 directly or after being reflected by the electrode 102, and is then transmitted through the transparent electrode 104. The light transmitted through the transparent electrode 104 impinges on a surface of the transparent substrate 105 at point P at an incidence angle θ from the normal to the surface. At the point P, the light is refracted to be emitted into an air layer 106.

When the incidence angle θ exceeds the critical angle $\theta_c = \sin^{-1}(1/n'_1)$ where $n'_1$ is the refractive index of the transparent substrate 105, total reflection occurs. For example, a light ray that is incident on the surface of the transparent substrate 105 at point Q at an angle x which is greater than or equal to $\theta_c$ is totally reflected without being emitted into the air layer 106.

FIGS. 19(a) and 19(b) are diagrams for illustrating the light extraction efficiency of the light emitting device on the assumption that the transparent substrate 105 has a multilayer structure. In FIG. 19(a), Formula 1 shown below holds according to Snell's law:

$$n'_k \times \sin\theta'_k = n'_{k-1} \times \sin\theta'_{k-1} = \ldots = n'_1 \times \sin\theta'_1 = n_0 \times \sin\theta_0 \quad \text{[Formula 1]}$$

where $n'_k$ is the refractive index of the light emitting layer 103; $n_0$ is the refractive index of the air layer 106; $n'_{k-1}, n_{k-2}, \ldots,$ and $n'_1$ are the refractive indices of a plurality of intervening transparent layers between the light emitting layer 103 and the air layer 106 in order of distance from the light emitting layer 103, closest first; $\theta'_k$ is the propagation direction of a light ray radiated from the point S in the light emitting layer 3 (the angle from the normal to a refracting surface); and $\theta'_{k-1}, \theta'_{k-2}, \ldots, \theta'_1,$ and $\theta_0$ are the angles of refraction at the refracting surfaces in order of distance from the light emitting layer 103, closest first. Therefore, Formula 2 shown below holds:

$$\sin\theta'_k = \sin\theta_0 \times n_0/n'_k \quad \text{[Formula 2]}$$

Thus, Formula 2 is basically identical with Snell's law under the condition that the light emitting layer 103 is in direct contacts with the air layer 106. Formula 2 means that total reflection occurs when $\theta'_k \geq \theta_c = \sin^{-1}(n_0/n'_k)$ irrespective of the refractive indices of the intervening transparent layers.

FIG. 19(b) schematically shows the range of light which can be extracted from the light emitting layer 103. The light which can be extracted is included in the extent of a pair of cones 107 and 107' whose vertexes are at the light radiation point S. The vertex angle of each of the cones 107 and 107' is twice the critical angle $\theta_c$. The center axes of the cones 107 and 107' are on the z-axis that is normal to the refracting surface. Assuming that the light is radiated from the point S with equal intensities in all directions and that the transmittance of light which is incident on the refracting surface at an incidence angle equal to or smaller than the critical angle is 100%, the extraction efficiency η from the light emitting layer 103 is equal to the ratio of part of the surface area of the sphere 108 corresponding to the circular bases of the cones 107 and 107' to the entire surface area of the sphere 108, and is expressed by Formula 3 shown below:

$$\eta = 1 - \cos\theta_c \quad \text{[Formula 3]}$$

Note that the actual extraction efficiency η is smaller than $1 - \cos\theta_c$ because the transmittance does not reach 100% even when the incidence angle is equal to or smaller than the critical angle. The total efficiency of the light emitting element is equal to a value obtained by multiplying the above-described extraction efficiency η by the light emission efficiency of the light emitting layer.

Patent Document 1 discloses an organic EL element in which a diffraction grating is formed in a substrate interface or a reflecting surface to change the incidence angle of light on a light extraction surface such that the light extraction efficiency is improved with the view of preventing total reflection of light propagating from the transparent substrate to the ambient air at the transparent substrate surface.

Patent Document 2 describes providing a plurality of protrusions over the surface of a transparent substrate of an organic EL element such that reflection of light at the interface between the transparent substrate and the air layer can be prevented, for the purpose of providing a planar light emitting device with excellent light extraction efficiency.

CITATION LIST

Patent Literature

Patent Document 1: Japanese Laid-Open Patent Publication No. 11-283751
Patent Document 2: Japanese Laid-Open Patent Publication No. 2005-276581

SUMMARY OF INVENTION

Technical Problem

However, the above-described conventional light emitting devices have problems which will be described below.

In a conventional light emitting device which employs the organic EL element shown in FIG. 18, the maximum value of the light extraction efficiency η from the light emitting layer 103 does not exceed $1 - \cos\theta_c$. If the refractive index of the light emitting layer 103 is determined, the maximum value of the light extraction efficiency is uniquely limited. For example, when $n_0 = 1.0$ and $n'_k = 1.457$ in Formula 2, the critical angle $\theta_c = \sin^{-1}(n_0/n'_k) = 43.34°$, and the maximum value of the light extraction efficiency is as small as about $1 - \cos\theta_c = 0.273$. When $n'_k = 1.70$, the maximum value of the light extraction efficiency is even smaller, e.g., about 0.191.

The technique disclosed in Patent Document 1 enables extraction of light which would otherwise be totally reflected, although the opposite case may occur. Specifically, there is a probability that a light ray, which would impinge on the refracting surface (emission surface) of the transparent substrate at an incidence angle smaller than the critical angle and then be transmitted and refracted when there was no diffraction grating layer, is diffracted by a diffraction grating layer so that the incidence angle on the refracting surface exceeds the critical angle, resulting in total reflection. This means that the technique disclosed in Patent Document 1 does not necessarily ensure the improvement of the light extraction efficiency. In the technique disclosed in Patent Document 1, diffracted light rays which are bent equally by predetermined angles are derived from each one of the light rays. Light including such diffracted light rays has a light intensity distribution which varies depending on the direction, and the angles by which the light rays are bent depend on the wavelength of emitted light. Thus, color imbalance occurs depending on the direction.

In the light emitting device disclosed in Patent Document 1, ambient light (incoming from the air layer side) is regularly reflected by the surface of the transparent substrate, and this reflection causes a disturbance with the light extracted from the light emitting layer (resulting in, so-called, "ambient light reflection"). Therefore, the surface of the transparent substrate needs an optical treatment, such as formation of an antireflection film or the like, which increases the manufacturing cost.

The light emitting device disclosed in Patent Document 2 is directed to antireflection at the refracting surface. The structure of Patent Document 2 only improves the light extraction efficiency by about 10% to 20%.

The present invention was conceived in view of the above circumstances. One of the objects of the present invention is to provide a sheet and a light emitting device, which enable light which is incident on the transparent substrate at an incidence angle equal to or greater than the critical angle to be emitted out such that the light extraction efficiency can be greatly improved, and which prevent ambient light reflection as well as variation in light intensity distribution and color imbalance which would occur depending on the direction.

Solution to Problem

The first sheet of the present invention is a sheet which is to be used such that light from a light emitting body impinges on one of surfaces of the sheet and outgoes from the other surface, wherein the other surface of the sheet includes a plurality of minute regions $\delta$, a largest inscribed circle of the minute regions $\delta$ having a diameter from 0.2 µm to 2 µm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, and light transmitted through the plurality of minute regions $\delta_1$ and light transmitted through the plurality of minute regions $\delta_2$ have a phase difference of $\pi$.

In one embodiment, the sheet further includes: a plurality of minute portions d1 which include respective ones of the plurality of minute regions $\delta_1$ and which extend in the thickness direction; and a plurality of minute portions d2 which include respective ones of the plurality of minute regions $\delta_2$ and which extend in the thickness direction, wherein the plurality of minute portions d1 include ½-wave plates which have identical optical axes, and the plurality of minute portions d2 include ½-wave plates which have identical optical axes, and a direction of the optical axes of the ½-wave plates of the plurality of minute portions d1 and a direction of the optical axes of the ½-wave plates of the plurality of minute portions d2 are arranged to form an angle of 45°.

The second sheet of the present invention is a sheet which is to be used such that light from a light emitting body impinges on one of surfaces of the sheet and outgoes from the other surface, wherein the other surface of the sheet includes a plurality of minute regions $\delta$, a largest inscribed circle of the minute regions $\delta$ having a diameter from 0.2 µm to 2 µm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, the sheet further includes a plurality of minute portions d1 which include respective ones of the plurality of minute regions $\delta_1$ and which extend in the thickness direction, and a plurality of minute portions d2 which include respective ones of the plurality of minute regions $\delta_2$ and which extend in the thickness direction, the plurality of minute portions d1 include polarizers which have identical transmission axes, and the plurality of minute portions d2 include polarizers which have identical transmission axes, and the transmission axes of the polarizers included in the plurality of minute portions d1 are perpendicular to the transmission axes of the polarizers included in the plurality of minute portions d2.

The third sheet of the present invention is a sheet which is to be used such that light from a light emitting body impinges on one of surfaces of the sheet and outgoes from the other surface, wherein the other surface of the sheet includes a plurality of minute regions $\delta$, a largest inscribed circle of the minute regions $\delta$ having a diameter from 0.2 µm to 2 µm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, the sheet further includes a plurality of minute portions d1 which include respective ones of the plurality of minute regions $\delta_1$ and which extend in the thickness direction, and a plurality of minute portions d2 which include respective ones of the plurality of minute regions $\delta_2$ and which extend in the thickness direction, and either of the plurality of minute portions d1 or the plurality of minute portions d2 have light-blocking surfaces.

In one embodiment, the plurality of minute regions $\delta_1$ and the plurality of minute regions $\delta_2$ are polygonal, and the plurality of minute regions $\delta_1$ and the plurality of minute regions $\delta_2$ are congruent with one another.

The first light emitting device of the present invention is a light emitting device which includes a light emitting body and a protection layer provided on a light emitting surface of the light emitting body, wherein one of surfaces of the protection layer opposite to the light emitting surface includes a plurality of minute regions $\delta$, a largest inscribed circle of the minute regions $\delta$ having a diameter from 0.2 µm to 2 µm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, light transmitted through the plurality of minute regions $\delta_1$ and light transmitted through the plurality of minute regions $\delta_2$ have a phase difference of $\pi$, and the surface of the protection layer opposite to the light emitting layer borders on a medium which has a lower refractive index than a refractive index of the protection layer.

In one embodiment, the light emitting device further includes: a plurality of minute portions d1 which include respective ones of the plurality of minute regions $\delta_1$ and which extend in the thickness direction; and a plurality of minute portions d2 which include respective ones of the plurality of minute regions $\delta_2$ and which extend in the thickness direction, wherein the plurality of minute portions d1 include ½-wave plates which have identical optical axes, and the plurality of minute portions d2 include ½-wave plates which have identical optical axes, and a direction of the optical axes of the ½-wave plates of the plurality of minute portions d1 and a direction of the optical axes of the ½-wave plates of the plurality of minute portions d2 are arranged to form an angle of 45°.

The second light emitting device of the present invention is a light emitting device which includes a light emitting body and a protection layer provided on a light emitting surface of the light emitting body, wherein one of surfaces of the protection layer opposite to the light emitting surface includes a plurality of minute regions $\delta$, a largest inscribed circle of the minute regions $\delta$ having a diameter from 0.2 μm to 2 μm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, the surface of the protection layer opposite to the light emitting layer borders on a medium which has a lower refractive index than a refractive index of the protection layer, the light emitting device further includes a plurality of minute portions d1 which include respective ones of the plurality of minute regions $\delta_1$ and which extend in the thickness direction, and a plurality of minute portions d2 which include respective ones of the plurality of minute regions $\delta_2$ and which extend in the thickness direction, the plurality of minute portions d1 include polarizers which have identical transmission axes, and the plurality of minute portions d2 include polarizers which have identical transmission axes, and the transmission axes of the polarizers included in the plurality of minute portions d1 are perpendicular to the transmission axes of the polarizers included in the plurality of minute portions d2.

The third light emitting device of the present invention is a light emitting device which includes a light emitting body and a protection layer provided on a light emitting surface of the light emitting body, wherein one of surfaces of the protection layer opposite to the light emitting surface includes a plurality of minute regions $\delta$, a largest inscribed circle of the minute regions $\delta$ having a diameter from 0.2 μm to 2 μm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, the surface of the protection layer opposite to the light emitting layer borders on a medium which has a lower refractive index than a refractive index of the protection layer, the light emitting device further includes a plurality of minute portions d1 which include respective ones of the plurality of minute regions $\delta_1$ and which extend in the thickness direction, and a plurality of minute portions d2 which include respective ones of the plurality of minute regions $\delta_2$ and which extend in the thickness direction, and either of the plurality of minute portions d1 or the plurality of minute portions d2 have light-blocking surfaces.

In one embodiment, the medium is air.

In one embodiment, the medium is aerogel.

Advantageous Effects of Invention

According to the present invention, the largest inscribed circle of the minute regions $\delta_1$, $\delta_2$ has a diameter from 0.2 μm to 2 μm and, as for light transmitted through the minute regions $\delta_1$, $\delta_2$, the direction, magnitude, or phase of the electric field vector is discontinuous at the boundary between the minute region $\delta_1$ and the minute region $\delta_2$. In such a case, the contour integral of the electric or magnetic field vector of light that is incident on the refracting surface is not zero, so that light is produced at the boundary between the minute region $\delta_1$ and the minute region $\delta_2$ (boundary diffraction effect). Due to this phenomenon, light that is incident on the minute regions $\delta_1$, $\delta_2$ at an angle greater than the critical angle can be extracted. Even light which has been reflected by an underlying layer before it impinges on the minute regions $\delta_1$, $\delta_2$ is also reflected by the underlying layer again toward the sheet side to impinge on the minute regions $\delta_1$, $\delta_2$. Thus, extraction of light can be repeatedly achieved, so that the light extraction efficiency can be greatly improved.

BRIEF DESCRIPTION OF DRAWINGS

FIG. 1(a) is a diagram which shows propagation of light 106 in the vicinity of the refracting surface 107a. FIG. 1(b) is a diagram which shows a stepwise change of the refractive index in the vicinity of the refracting surface 107a. FIG. 1(c) is a diagram which shows a moderate change of the refractive index in the vicinity of the refracting surface 107a. FIG. 1(d) is a graph which illustrates the relationship between the incidence angle at the refracting surface and the transmittance.

DESCRIPTION OF EMBODIMENTS

Before the descriptions of embodiments of the present invention, the research history prior to the creation of the concept of the present invention is described with considerations for the prior art examples such as disclosed in Patent Document 1 and Patent Document 2.

FIGS. 1(a) to 1(d) illustrate the transmittance at a refracting surface (the interface between a transparent layer surface and an air layer).

Figure 1:
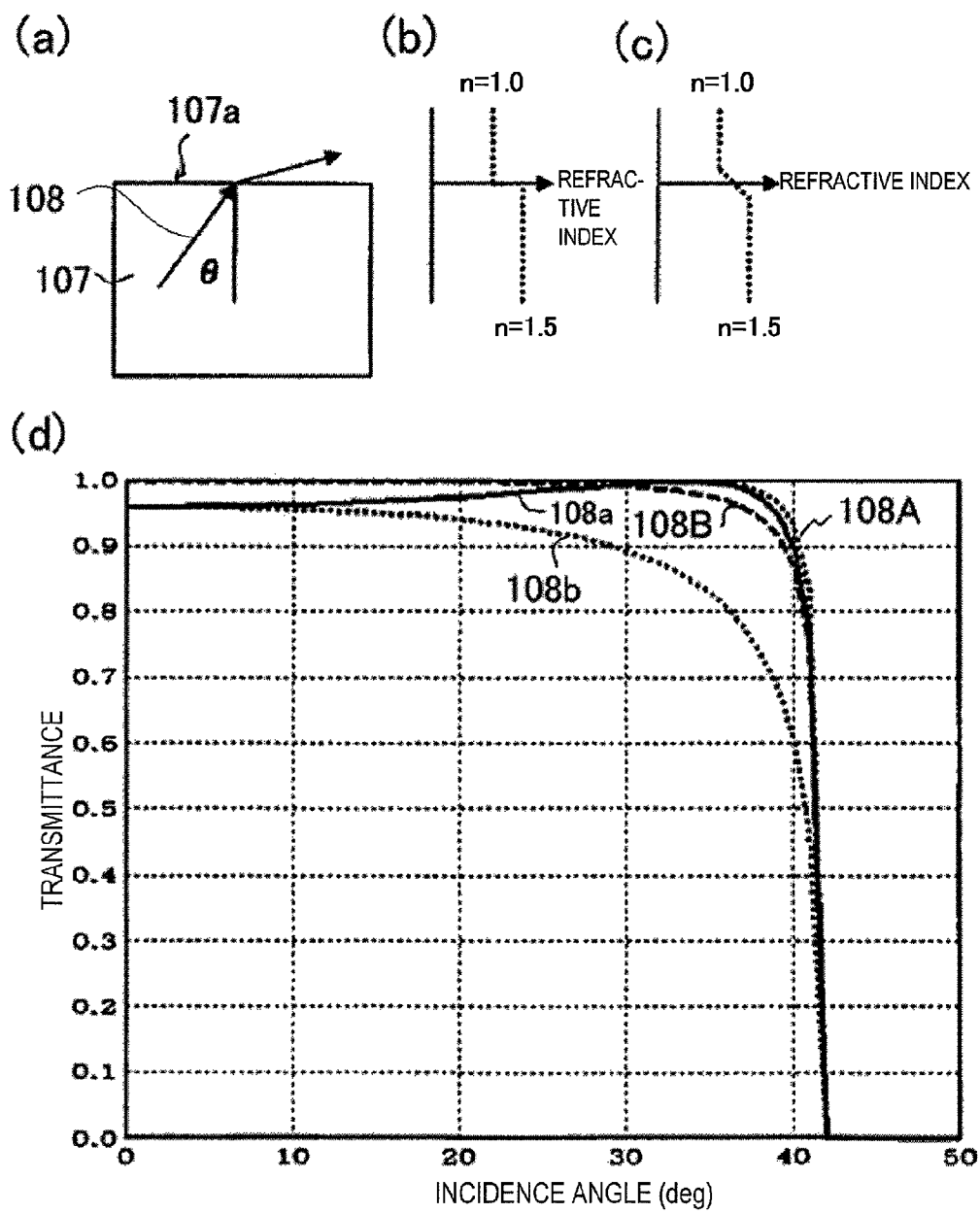

A light ray 108 shown in FIG. 1(a) travels from the inside of the transparent layer 107 with the refractive index of 1.5 along a sheet direction and impinges on a refracting surface 107a of the transparent layer 107 at an incidence angle θ so that the light ray 108 is emitted into the air layer (refractive index: 1.0). At the refracting surface 107a, the light ray 108 is refracted to travel in a path closer to the refracting surface 107a.

FIGS. 1(b) and 1(c) show the distributions of the refractive index in the vicinity of the refracting surface 107a. In FIGS. 1(b) and 1(c), the ordinate axis represents the position in the transparent layer 107 and the air layer. The position corresponding to the abscissa axis value "0" represents the refracting surface 107a. In FIGS. 1(b) and 1(c), the abscissa axis represents the refractive index.

Usually, the refractive index distribution along the normal to the refracting surface 107a in the vicinity of the refracting surface 107a has a stepped shape as shown in FIG. 1(b), and the refractive index changes discontinuously across the refracting surface 107a that serves as the boundary. In this case, the P-polarization (an oscillation component whose electric field vector is parallel to the sheet of the drawing) exhibits a transmittance characteristic represented by the curve 108a of FIG. 1(d), and the S-polarization (an oscillation component whose electric field vector is perpendicular to the sheet of the drawing) exhibits a transmittance characteristic represented by the curve 108b of FIG. 1(d). The transmittances of the curves 108a and 108b are different from each other when the incidence angle is not more than the critical angle (=41.8°) but become zero as the incidence angle exceeds the critical angle.

On the other hand, assuming that the outermost part of the transparent layer 107 has a multilayer structure so that the refractive index distribution has a tapered shape as shown in FIG. 1(c), the P-polarization exhibits a transmittance characteristic represented by the curve 108A of FIG. 1(d), and the S-polarization exhibits a transmittance characteristic represented by the curve 108B of FIG. 1(d). The transmittances of the curves 108A and 108B become zero when the critical angle is exceeded, as do the curves 108a and 108b. On the other hand, the transmittance for angles not more than the critical angle is closer to 100% in the curve 108A than in the curve 108a. Likewise, the transmittance for angles not more than the critical angle is closer to 100% in the curve 108B than in the curve 108b. Thus, the curves 108A and 108B are more approximate to the shape of a step function with the border occurring at the critical angle than the curves 108a and 108b. Here, the multilayer structure of FIG. 1(c) is composed of 50 stacked layers each having the thickness of 0.01 μm, with the refractive index varying from 1.5 to 1.0 with the intervals of 0.01. The difference between the P-polarization and the S-polarization decreases as the ramp of the change of the refractive index along the thickness direction is more moderate so that, as a result, as for the both polarizations, the graph of the transmittance relative to the incidence angle approaches to a step function.

To prevent total reflection at the refracting surface, it is necessary to provide any means of controlling the incidence angle of light that is incident on the refracting surface so as to be equal to or smaller than the critical angle. The present inventor studied, as an example of such means, a light emitting device disclosed in Patent Document 1, which is shown in FIGS. 2(a) and 2(b). The light emitting device shown in FIGS. 2(a) and 2(b) is an organic EL element in which a diffraction grating 209 is provided at the interface between a transparent substrate 205 and a transparent electrode 204.

As shown in FIG. 2(a), an electrode 202, a light emitting layer 203, a transparent electrode 204, and a diffraction grating layer 209 are stacked on a substrate 201 in this order, and a transparent substrate 205 is provided on the diffraction grating layer 209. The diffraction grating layer 209 has a periodic structure of raised portions and recessed portions with the pitch of Λ, in both x-direction and y-direction, in its surface bordering on the transparent substrate 205. The shape of the raised portion may be a right square with width was shown in FIG. 2(b). The raised portions having such a shape are in a matrix-lattice arrangement. Application of a voltage between the electrode 202 and the transparent electrode 204 causes radiation inside the light emitting layer 203 (e.g., point S). This light enters the transparent electrode 204 directly or after being reflected by the electrode 202 and is transmitted therethrough. The light is then transmitted through the diffraction grating layer 209 so that it undergoes diffraction. For example, assuming that a light ray 210a emitted from the point S travels straight without being diffracted by the diffraction grating layer 209, the light ray 210a would impinge on a refracting surface 205a of the transparent substrate 205 at an incidence angle equal to or greater than the critical angle and be totally reflected by the refracting surface 205a as represented as a light ray 210b. However, in actuality, the light ray is diffracted by the diffraction grating layer 209 so that the incidence angle of the light ray on the refracting surface 205a is smaller than the critical angle as represented as a light ray 210c. Thus, total reflection of light can be prevented.

Figure 3:
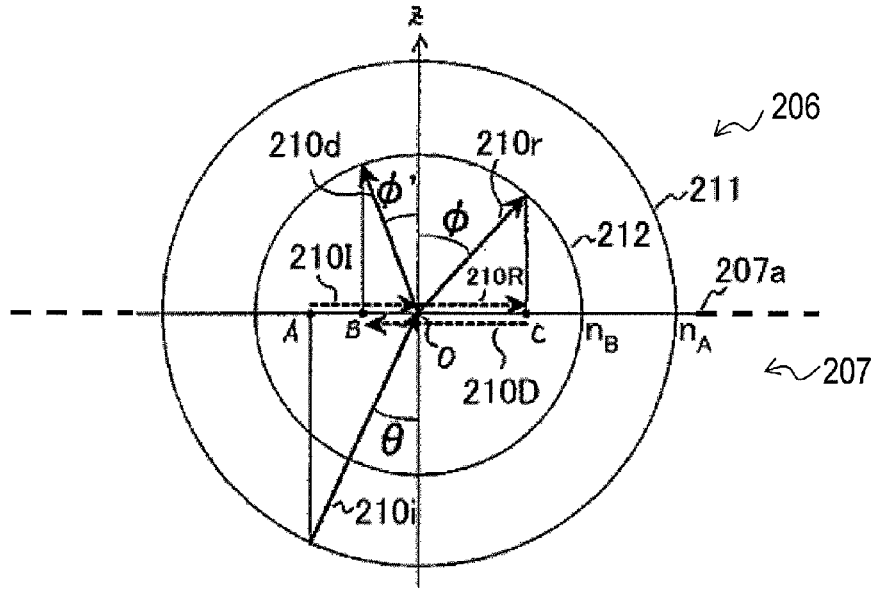
FIG. 3 illustrates the direction of diffraction caused by a diffraction grating.

The direction of diffraction of light by the above-described diffraction grating is described with reference to FIG. 3. Now, consider a light ray traveling from the inside of a transparent layer 207 of refractive index $n_A$ along the sheet direction and impinging on a refracting surface 207a of the transparent layer 207 at the point O at the incidence angle θ so that the light ray is diffracted toward a transparent layer 206 of refractive index $n_B$. Although not shown in FIG. 3, the refracting surface 207a is provided with a diffraction grating of pitch Λ along the surface of the sheet of the drawing. For the sake of illustration, a circle 211 around the point O at the center with radius $n_A$ and a circle 212 around the point O at the center with radius $n_B$ are shown in FIG. 3. Here, a vector originating from a point on the circle 211 and directed to the point O at angle θ is referred to as incidence vector 210i, and the orthogonal projection vector of the incidence vector 210i onto the refracting surface 207a (a vector extending from the foot of the perpendicular A to the point O) is denoted by 210I. A vector 210r originating from the point O and terminating at a point on the circle 212 is drawn such that the orthogonal projection vector 210R of the vector 210r is identical with the vector 210I. Now consider a vector (grating vector) originating from the foot of the perpendicular C and having largeness qλ/Λ. Here, q denotes the order of diffraction (integer). The drawing shows a vector 210D for q=1. A vector 210d originating from the point O and terminating at a point on the circle 212 is also drawn such that the terminal B of the vector 210D is coincident with the foot of the perpendicular of the vector 210d. The distance along x-direction that the light ray 210i travels inside the transparent layer 207 (refractive index $n_A$) per unit time, i.e., the length of the vector 210I, is represented by $n_A \times \sin θ$. On the other hand, the distance along x-direction that the light ray 210r travels inside the transparent layer 206 (refractive index $n_B$) per unit time, i.e., the length of the vector 210R, is represented by $n_B \times \sin φ$. The length of the vector 210I is equal to the length of the vector 210R, Formula 4 shown below holds. From Formula 4, the directional angle φ of the vector 210r (the angle between the vector 210r and the normal to the refracting surface), which represents the direction of the refracted light ray, is given:

$$n_B \times \sin φ = n_A \times \sin θ \quad \text{[Formula 4]}$$

This exactly represents the Snell's law. On the other hand, the directional angle φ' of the vector 210d that represents the direction of the diffracted light ray (the angle between the vector 210d and the normal to the refracting surface) is expressed by Formula 5 shown below:

$$n_B \times \sin φ' = n_A \times \sin θ - qλ/Λ \quad \text{[Formula 5]}$$

In FIG. 3, the angle φ' is defined by a negative value because it passes across the z-axis (a normal to the refracting surface which passes through the point O).

Figure 2:
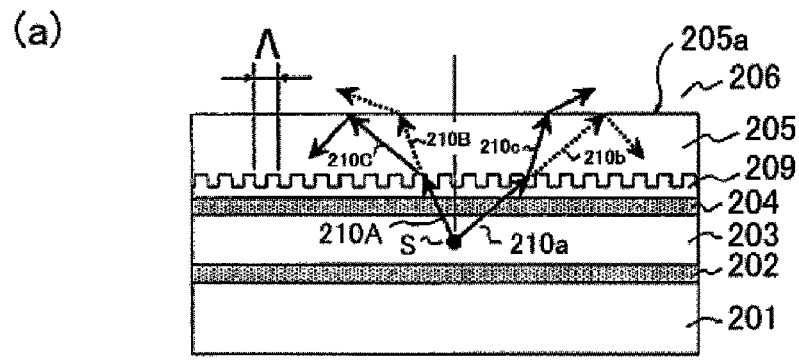
FIG. 2(a) shows a cross section of a light emitting device which includes a diffraction grating having a periodic structure in a surface.
FIG. 2(b) is the top view of the light emitting device of FIG. 2(a).
Figure 2:
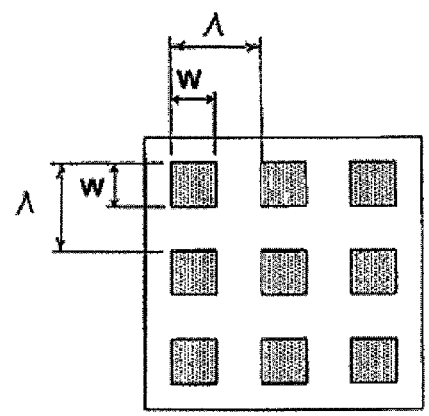

Thus, as seen from the results of Formula 4 and Formula 5, the traveling direction of the diffracted light ray (vector 210d) is deviated from the traveling direction of the refracted light ray (vector 210r) by qλ/Λ. In FIG. 2(a), the light ray 210b that is assumed as not undergoing diffraction is equivalent to a refracted light ray of FIG. 3 (vector 210r). On the other hand, the light ray 210c that is assumed as undergoing diffraction in FIG. 2 is equivalent to the diffracted light ray of FIG. 3 (vector 210d). Thus, the light ray 210c has a direction deviated from the light ray 210b by qλ/Λ so that it does not undergo total reflection at the refracting surface 205a. Therefore, a light ray which would otherwise have been totally reflected can be extracted, so that the improvement of the light extraction efficiency may be more probable than in an organic EL light emitting device which does not include a diffraction grating layer.

However, when considering a light ray 210A emitted from the point S in FIG. 2(a), the following problem arises. Assuming that the light ray 210A travels straight without undergoing diffraction by the diffraction grating layer 209, the light ray 210A would impinge on the refracting surface 205a of the transparent substrate 205 at an incidence angle equal to or smaller than the critical angle and be refracted by the refracting surface 205a while being transmitted therethrough as represented as a light ray 210B. However, in actuality, it is diffracted by the diffraction grating layer 209, and therefore, the incidence angle of the light on the refracting surface 205a is greater than the critical angle as represented as a light ray 210C, resulting in total reflection. Thus, providing the diffraction grating layer 209 does not necessarily ensure the improvement of the light extraction efficiency.

In a light emitting device which includes the organic EL element shown in FIG. 2, diffracted light rays whose directions are equally shifted by qλ/Λ are derived from every one of the light rays. The light including such diffracted light rays has a light intensity distribution which varies depending on the direction, and the shift width qλ/Λ depends on the wavelength λ of emitted light. Therefore, color imbalance occurs depending on the direction in which the light is emitted. Specifically, the color of perceived light differs depending on the viewing direction. Thus, such a characteristic is not suitable to display applications, as a matter of course, and is also not suitable to light sources.

Next, the present inventor studied a light emitting device disclosed in Patent Document 2, which is shown in FIGS. 4(a) and 4(b). The light emitting device shown in FIGS. 4(a) and 4(b) is an organic EL element in which protrusions 315 are provided on the surface of a transparent substrate 305. As shown in FIG. 4(a), an electrode 302, a light emitting layer 303, a transparent electrode 304, and a transparent substrate 305 are stacked on a substrate 301 in this order, and a plurality of protrusions 315 are provided on the surface 305a of the transparent substrate 305. Each of the protrusions 315 is in the shape of a quadrangular prism of width w and height h. The protrusions 315 having such a shape are placed at random positions over the transparent substrate surface 305a as shown in FIG. 4(b). Here, w is in the range of 0.4 μm to 20 μm, and h is in the range of 0.4 μm to 10 μm. Such protrusions 315 are provided in the density of 5000 to 1000000 protrusions/mm². Application of a voltage between the electrode 302 and the transparent electrode 304 causes radiation inside the light emitting layer 303 (e.g., point S). This light ray 310d enters the transparent electrode 304 directly or after being reflected by the electrode 302 and is transmitted therethrough. Part of the transmitted light is extracted outside via the protrusions 315 as represented as a light ray 310f.

The present inventor estimated the reason why the light emitting device shown in FIGS. 4(a) and 4(b) has improved light extraction efficiency as follows. The actual protrusions 315 can be processed by means of side etching so as to be tapered to the tip end and, even without the side etching, the actual protrusions 315 are spontaneously processed into a tapered shape, so that the effective refractive index falls on a value around the midpoint between the transparent substrate 305 and the air layer. Therefore, the refractive index distribution can be changed constantly and moderately. In this case, the refractive index distribution approaches to one that is shown in FIG. 1(c). Reflection of light, such as represented by arrow 310e, can be partially prevented by the protrusions 315. As a result, the light extraction efficiency can be improved.

Even when the size of the protrusions 315 is equal to or greater than the wavelength, the interference of emitted light rays can be prevented because the protrusions 315 are in a random arrangement.

Figure 4:
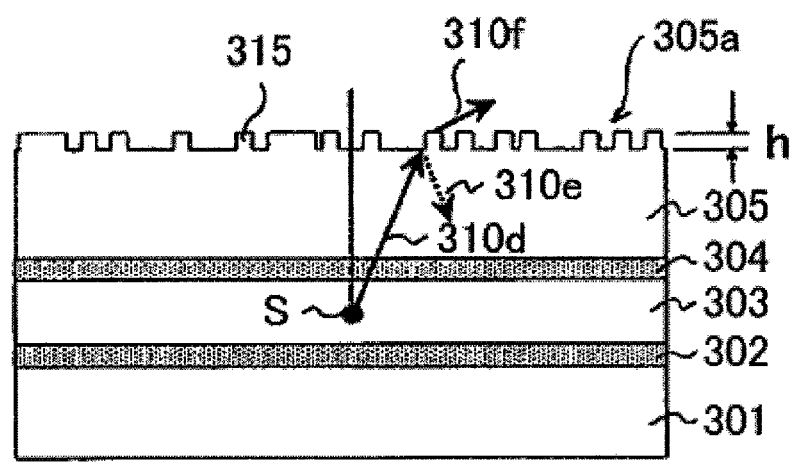
FIG. 4(a) shows a cross section of a light emitting device which has protrusions randomly arranged on the surface.
FIG. 4(b) is a top view of the light emitting device of FIG. 4(a).
Figure 4:
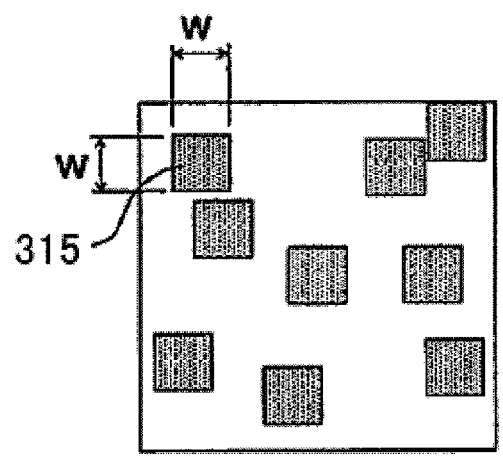

However, in a light emitting device which has the structure shown in FIG. 4, as seen from the comparison between the curves 108a and 108b and the curves 108A and 108B of FIG. 1(d), the improvement in transmittance is achieved only for the light rays that are incident at angles equal to or smaller than the critical angle. As a result, the improvement of the light extraction efficiency is only 10% to 20%, in which a great improvement is not probable.

After the above studies, the present inventor continued to examine how to decrease the amount of total reflection by the refracting surface and how to increase the amount of light which can be extracted. At the beginning of the continued examination, the present inventor studied the boundary conditions of light at the refracting surface.

Figure 5:
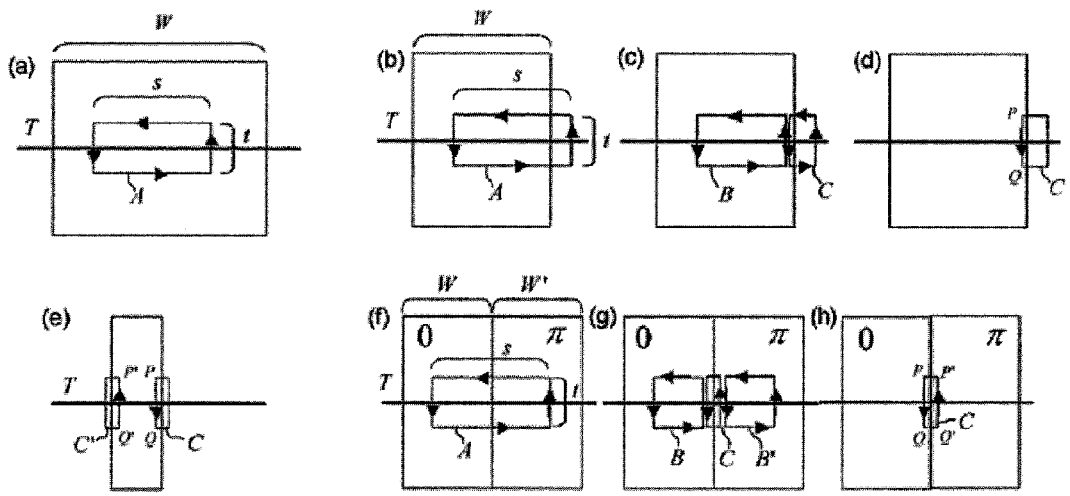
FIGS. 5(a) to 5(h) illustrate the boundary conditions of a field of light at a refracting surface.

FIG. 5 schematically illustrates the boundary conditions of a field of light at the refracting surface. Here, a light beam of width W impinging on the refracting surface T is considered. According to the Maxwell equations, the integral of an electric field vector or a magnetic field vector along a closed path A that is traced so as to traverse the refracting surface T is zero. Note that the premises assumed herein are that there is not a charge or a light source in an area inside the closed path and that, as for the light at the refracting surface, the direction, phase, and magnitude of the electric or magnetic field vector along the refracting surface T are continuous.

When width W is sufficiently large as shown in FIG. 5(a), width t that is perpendicular to the refracting surface can be negligibly small as compared with width s that is taken along the refracting surface so that, of the contour integral of the electric or magnetic field vector, only components along the refracting surface are remaining. This relationship requires that the electric or magnetic field vector is continuous so as to extend through the refracting surface. One that is derived by utilizing this continuity relationship is the Fresnel's formula, by which the laws of reflection and refraction, the phenomenon of total reflection, etc., are completely elucidated.

As shown in FIG. 5(b), when the width W of the light is several ten times smaller than the wavelength, the width t is normegligible. Here, when the contour integral A is divided into B and C (see FIG. 5(c)), the contour integral B is included in the light beam (or "a bundle of rays") and is therefore zero. As for the remaining contour integral C, the electric or magnetic field vector outside the light beam is zero, so that only the integral value of the path PQ that is within the light beam is remaining (see FIG. 5(d)). Therefore, the contour integral C is not zero so that, by calculation, it is equivalent to a condition where light is radiated inside the closed path. When the width W of the light beam is as small as about 1/10 of the wavelength, the contour integrals C and C' become closer to each other as shown in FIG. 5(e) so that the paths PQ and Q'P' overlap with each other. Accordingly, the contour integral of C plus C' is zero, so that light cannot be radiated within the closed path.

On the other hand, on the assumption that the regions that are to emit light beams between which the phase difference is π occur side by side along the refracting surface as shown in FIG. 5(f), the contour integral A which extends over these light beams is now considered. In this case also, when the width W of the light is several ten times smaller than the wavelength, the width t is normegligible. Here, when the contour integral A is divided into B, C, and B' (see FIG. 5(g)), the contour integrals B and B' are included in the light beams so that they are zero. As for the remaining contour integral C, the components along the refracting surface are negligible, so that only the integral value of the paths PQ and Q'P' that extend along the boundary between the two light beams is remaining (see FIG. 5(h)). Since the integral along the path Q'P' in a field in which the phase of the light beam is π is equal to the integral along the path P'Q' of a field in which the phase of the light beam is 0, the contour integral C is twice the integral along the path PQ so that, by calculation, it is equivalent to a condition where light is radiated inside the closed path. Therefore, not only in the case of a narrow light beam but also in the case where light beams in different phases occur side by side with a narrow gap therebetween, light occurs near the boundary between the regions. (This phenomenon is not actual emission of light but behavior of light which is effectively equivalent to emission of light. This is similar to a phenomenon called "boundary diffraction" by Young prior to the establishment of the diffraction theory, and is therefore referred to as a "boundary diffraction effect.") A phenomenon of this type can occur likewise in a case where regions that are to emit light beams whose directions of oscillation of the electric field vectors are perpendicular to each other are side by side along the refracting surface, and in a case where a region through which light is transmitted and a region in which light is blocked are side by side along the refracting surface.

As the phase of the light beam is deviated from π, the amount of radiation gradually decreases, although radiation of light occurs.

If radiation of light occurs on the refracting surface T, the light would propagate through both media on the opposite sides of the refracting surface irrespective of the incidence conditions on the refracting surface T. That is, even in the case of a light ray that is incident at an angle equal to or greater than the critical angle, it is estimated that transmitted light rays would occur without being totally reflected so long as the structure is configured by calculation such that radiation of light occurs on the refracting surface. Based on the results of such examinations, the present inventors studied the structure of the refracting surface, as will be described below, with the view of actually producing a phenomenon that light is transmitted through the refracting surface even when the incidence angle of the light on the refracting surface exceeds the critical angle.

Figure 6:
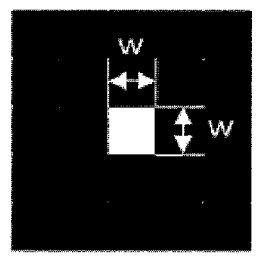
FIG. 6(a) shows an arrangement of a pinhole.
FIG. 6(b) shows an arrangement of phase shifters.
Figure 6:
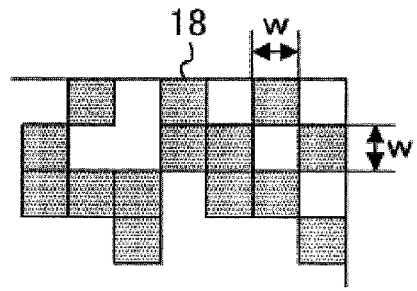

Two examples shown in FIG. 6 were examined, in which a large boundary diffraction effect is obtained. (a) A pinhole is provided at the boundary between a transparent substrate placed on a light emitting body and the air layer while light is blocked in the other area so that pinhole light is obtained (light exists only in a region of width w). (b) 180°-phase shifters 18 are arranged at random in the boxes of a chessboard-like grid, each box having width w. First, the pinhole example was examined, but actual light extraction via the pinhole could not be achieved. The example of phase shifters in a random arrangement was examined which was expected to achieve an equal light extraction characteristic to that of the pinhole.

FIG. 7(a) is a graph which illustrates the incidence angle dependence of the transmittance t at the refracting surface in the structure shown in FIG. 6. In FIG. 7(a), a light beam at the wavelength of 0.635 μm, the light amount of which is 1 in a transparent substrate with the refractive index of 1.457, impinges on the boundary between the transparent substrate and the air layer at the incidence angle θ (the angle between the light beam and the normal to the refracting surface). The curves show how much of the light impinging on the refracting surface for the first time is emitted into the air, with the parameter of width w (w=0.1, 0.2, 0.4, 1.0, 2.0, 4.0, 20.0

(μm)). (The 180°-phase shifters are used instead because the pinhole light and the 180°-phase shifters exhibit exactly equal characteristics.) As for the characteristic for w=20 μm which is approximate to that obtained in the conditions of FIG. 5(a), the transmittance is approximately zero when the critical angle) (43.34°) is exceeded. When w decreases to 0.4 to 1.0 μm, the transmittance is large even when the critical angle is exceeded, due to the boundary diffraction effect which has been described with reference to FIGS. 5(d) and 5(h). When w is further decreased (w=0.1 μm, 0.2 μm), the transmittance becomes closer to 0 at every incidence angle as described with reference to FIG. 5(e). Note that the analysis result of FIG. 7(a) is based on the Helmholtz's wave equation (so called "scalar wave equation"), and therefore, no difference occurs between the P-polarization and the S-polarization.)

In the graph shown in FIG. 7(a), at incidence angles smaller than the critical angle, the transmittance for w=20.0 μm is approximately 1. When w has a different value, the transmittance is smaller than 1. However, the total amount of light increases for the following reasons. As shown in FIG. 7(b), at the point S on the phase shifter 18 (shown in FIG. 6), light rays come in from various angles. In FIG. 7(b), light rays come in from the negative range of the Z axis and go toward the positive range. Among the light rays that are incident on the point S, light rays 30 which are incident on the phase shifter 18 at an angle smaller than the critical angle and light rays 31 which are incident on the phase shifter 18 at an angle greater than the critical angle are now compared. The light rays 31 whose incidence angle is relatively large come in from a larger region, and hence have a larger amount of light, than the light rays 30 whose incidence angle is relatively small. Among these light rays, the light rays 30, whose incidence angle is smaller than the critical angle, are emitted to the air layer side without undergoing inversion at the phase shifter 18. On the other hand, the light rays 31, whose incidence angle is greater than the critical angle, are partially reflected by the phase shifter 18 and partially emitted to the air layer side due to the boundary diffraction effect. Here, since the light rays 31 have a larger amount of light than the light rays 30, the total amount of light increases so long as the transmittance of the light rays 31 whose incidence angle is greater than the critical angle improves (w=0.2, 0.4, 1.0, 2.0 (μm)), even when the transmittance decreases for the light rays 30 whose incidence angle is smaller than the critical angle decreases as shown in FIG. 7(a).

Based on the above results, the present inventors continued studies to finally arrive at a novel light emitting device in which total reflection is prevented so that the light extraction efficiency can be greatly improved.

Hereinafter, embodiments of the present invention will be described in detail with reference to the drawings. In the drawings, components that have substantially the same functions are denoted by the same reference numerals for the sake of simplicity of description.

(First Embodiment)

Hereinafter, the first embodiment of a sheet (protection layer) and a light emitting device according to the present invention is described with reference to FIGS. 8 to 13. The light emitting device of the present embodiment is an organic EL element.

Figure 8:
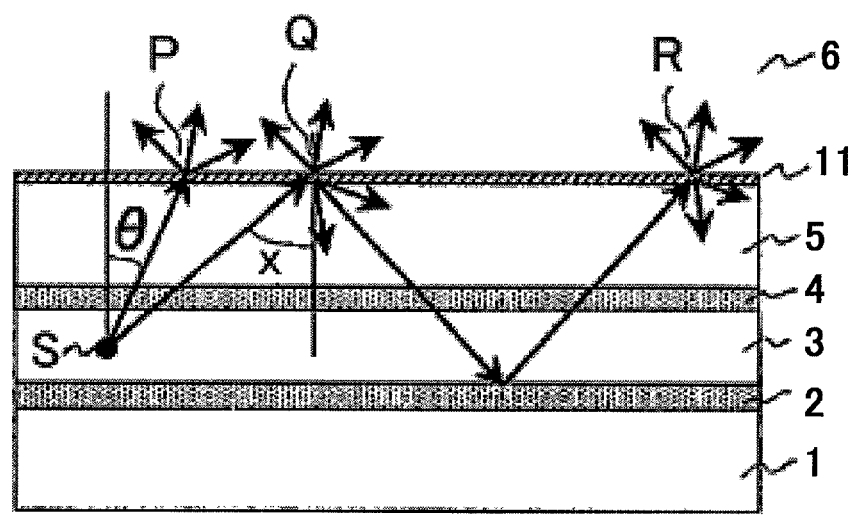
FIG. 8 shows a cross-sectional structure of an organic electroluminescence element of the first embodiment of the present invention and propagation of light.
Figure 9:
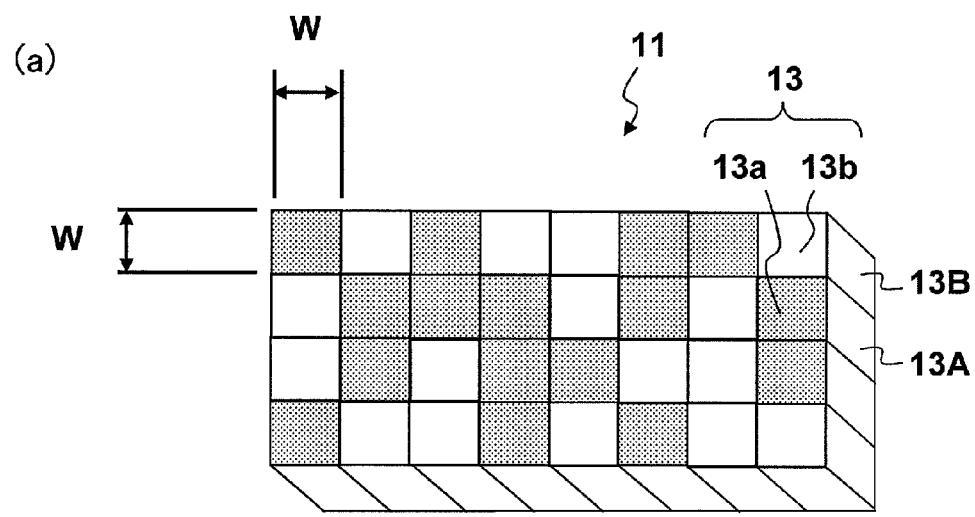
FIG. 9(a) is an enlarged view showing part of the minute regions 13 of the first embodiment.
FIG. 9(b) is a pattern diagram which covers a broader area than that shown in FIG. 9(a).
Figure 9:
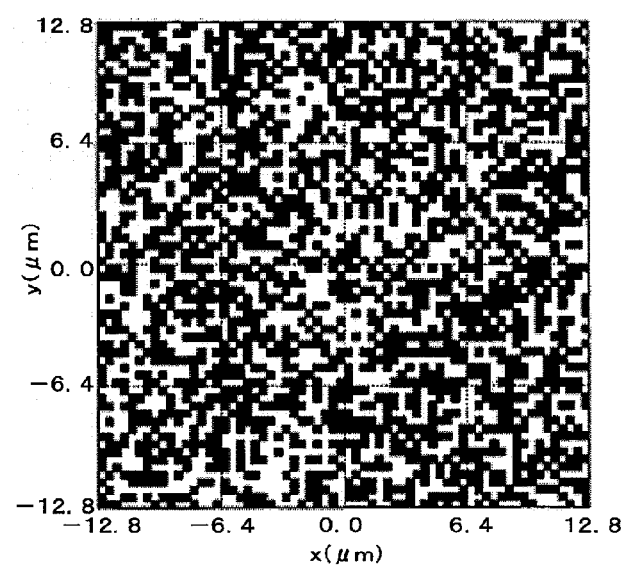

FIG. 8 shows a cross-sectional structure of an organic EL element of the first embodiment and propagation of light. In the organic EL element of the present embodiment, an electrode 2, a light emitting layer 3, a transparent electrode 4 are stacked on a substrate 1 in this order, and a transparent substrate (transparent protection layer) 5 is provided on the transparent electrode 4 for protecting the transparent electrode 4.

In the organic EL element, the substrate 1, the electrode 2, the light emitting layer 3, and the transparent electrode 4 constitute a light emitting body. There is a protection layer 11 provided on the transparent substrate 5. The protection layer 11 is arranged such that a light ray from the light emitting body impinges on a surface of the protection layer 11 (which is on the transparent substrate 5 side) and goes out from the other surface (which is opposite to the transparent substrate 5). The surface of the protection layer 11 opposite to the transparent substrate 5 is provided with a plurality of minute regions 13 (minute regions δ).

FIG. 9(a) shows a pattern of the minute regions 13 of the first embodiment. As shown in FIG. 9(a), in the protection layer 11, the minute regions 13 include the minute regions 13a, 13b (minute regions $δ_1$, $δ_2$). The minute regions 13a, 13b are defined by imaginarily dividing a surface of the protection layer 11 opposite to the organic EL element into boxes (squares) of a chessboard-like grid, each having width w (referred to as "boundary width"), without leaving any gap therebetween.

Each of the minute regions 13a and the minute regions 13b is adjoined by and surrounded by some other minute regions 13a, 13b.

The minute regions 13a constitute 20% to 80% of all of the minute regions 13. The minute regions 13b constitute the remaining part of the minute regions 13, other than the minute regions 13a. For example, it is preferred that the minute regions 13a, 13b respectively constitute 50% of the minute regions 13.

The minute regions 13a, 13b have such a size that the diameter of the largest inscribed circle is 0.2 μm to 2 μm.

In the minute regions 13a and the minute regions 13b, minute polarizers having mutually perpendicular transmission axes are provided without leaving any gap therebetween. The polarizers are provided in minute portions 13A which include the minute regions 13a and which extend in the thickness direction (minute portions d1) and in minute regions 13B which include the minute regions 13b and which extend in the thickness direction (minute portions d2).

Thus, the direction of oscillation of the electric field vector of light transmitted through the minute regions 13a is perpendicular to the direction of oscillation of the electric field vector of light transmitted through the minute regions 13b and, as for the light transmitted through the minute regions 13a, 13b, the directions of the electric field vectors are discontinuous. Accordingly, the contour integral of the electric field vector of light which is incident on the refracting surface is not zero. Therefore, light is produced at the boundary between the minute region 13a and the minute region 13b ("boundary diffraction effect").

Note that the extent of the meaning of the statement, "the direction of oscillation of light transmitted through the minute regions 13a is perpendicular to the direction of oscillation of light transmitted through the minute regions 13b," includes a case where the direction of oscillation has a deviation from the perpendicular directions due to manufacturing errors of the minute portions 13A, 13B and measurement errors in measurement of the direction of oscillation of light.

Figure 10:
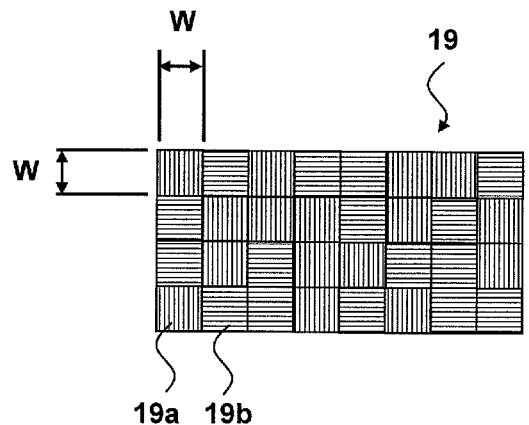
FIG. 10 shows a pattern of a protection layer of the first embodiment.

FIG. 10 schematically shows the arrangement of the polarizers 19a, 19b in the protection layer 11. The polarizers 19a, 19b have optically anisotropic structures in their planes and only allow transmission of mutually perpendicular polarization components. The transmission axes of the polarizers 19a of the minute portions 13A are identical with one another. The transmission axes of the polarizers 19b of the minute portions 13B are identical with one another. The transmission axes of the polarizers 19a of the minute portions 13A are perpendicular to the transmission axes of the polarizers 19b of the minute portions 13B. In each of the polarizers 19a, 19b, one of the polarization components is transmitted, while the other polarization component is blocked (or reflected).

When these polarizers 19a, 19b are used, the difference of the traveled distance of light between the minute regions 13a and the minute regions 13b is zero because it is not necessary to provide an uneven structure of recessed and raised portions in the surface of the protection film 11, while the light transmitted through the minute regions 13a, 13b have a difference in phase.

FIG. 9(b) shows a region of the surface of the protection layer 11, which is larger than that shown in FIG. 9(a). In FIG. 9(b), the minute regions 13a are represented by black boxes, and the minute regions 13b are represented by white boxes. In the protection layer 11 shown in FIG. 9(b), w is 0.4 μm.

In the present embodiment, it is preferred that the arrangement of the minute regions 13a, 13b is nonperiodic (i.e., the minute regions 13a, 13b are in a random arrangement). Note that the "arrangement" herein refers to an arrangement in the plane of a surface of the protection film 11 opposite to the organic EL element of the protection layer 11 and does not refer to the arrangement along the thickness direction of the protection layer 11. Also, the minute regions 13 in which the minute regions 13a, 13b are respectively provided are square and have such a size that "the diameter of the largest inscribed circle is 0.2 μm to 2 μm". Thus, the shape and size of the minute regions 13 are not in the category of "nonperiodic" features.

Light diffracted by such a random arrangement pattern due to the boundary diffraction effect has random traveling directions. Therefore, there is not a light intensity distribution which varies depending on the direction as in the light emitting device described in Patent Document 1, and there is no color imbalance depending on the direction. Light incoming from the external environment (air layer side) is reflected by the transparent substrate 5. This reflected light is diffracted in random directions, so that an ambient image is not reflected in the surface. Therefore, an optical treatment, such as an antireflection film or the like, is not necessary and, accordingly, the manufacturing cost can be decreased.

In the present embodiment, application of a voltage between the electrode 2 and the transparent electrode 4 causes radiation of light in the light emitting layer 3 (e.g., at point S). This light enters the transparent electrode 4 directly or after being reflected by the electrode 2 and is transmitted therethrough. The transmitted light impinges on the protection layer 13 on the surface of the transparent substrate 5 at point P at the angle θ relative to the normal to the surface. At point P, the light is diffracted to be emitted into the air 6.

Total reflection must occur when the incidence angle θ is greater than the critical angle $\theta c = \sin^{-1}(n_0/n_1)$ where $n_0$ is the refractive index of the air layer 6 and $n_1$ is the refractive index of the transparent substrate 5. However, there is the protection layer 11 on the surface of the transparent substrate 5, and therefore, light impinging on point Q at an incidence angle x that is equal to or greater than the critical angle $\theta_c$ is diffracted without being totally reflected, so that the diffracted light is emitted into the air layer 6 (first light extraction). Note that, at point Q, part of the light is reflected. The reflected component is then reflected by the electrode 2 and again impinges on the protection layer 11 at point R. Part of the light impinging on the protection layer 11 at point R is emitted into the air layer 6 (second light extraction) while the remaining part of the light is reflected. This process is repeated endlessly.

Now, consider a light emitting device which includes a conventional organic EL element. Light transmitted through the transparent substrate and impinging on the interface between the transparent substrate and the air layer at an incidence angle equal to or greater than the critical angle is totally reflected. Even if the totally reflected light is then reflected by the electrode, the light reflected by the electrode impinges on the interface between the transparent substrate and the air layer again at an incidence angle equal to or greater than the critical angle. As such, the second and subsequent light extractions do not occur in the conventional example. In this point, the conventional example is different from the present embodiment.

Figure 7:
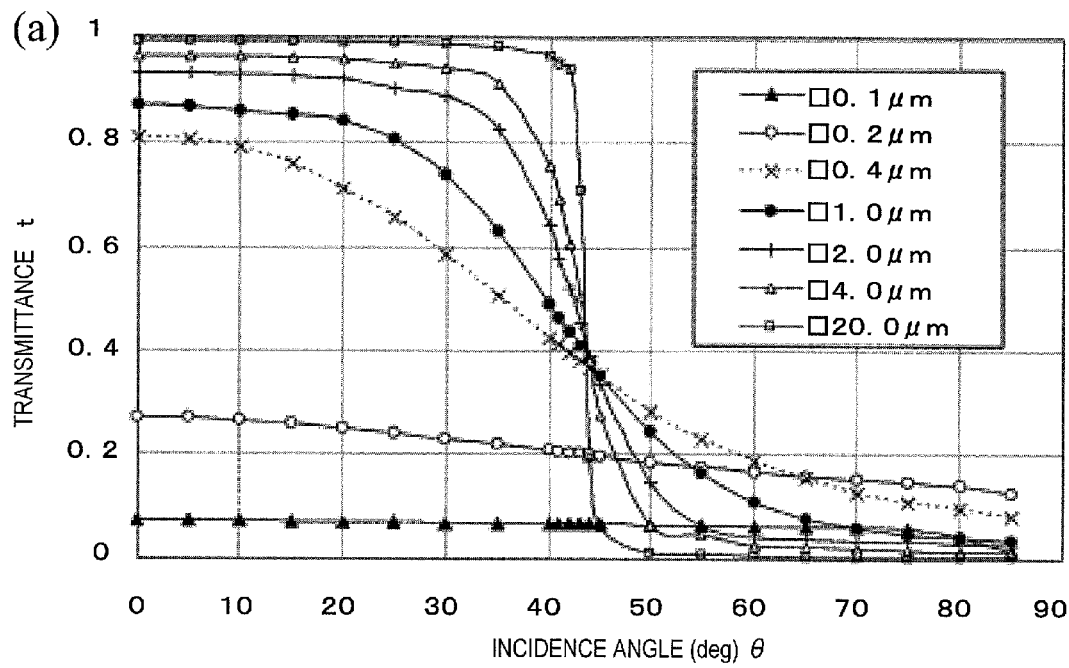
FIG. 7(a) is a graph which illustrates the incidence angle dependence of the transmittance t at the refracting surface in the structure shown in FIG. 6.
FIG. 7(b) is a diagram for illustrating the reason why the amount of light emitted from the structure shown in FIG. 6 increases.
Figure 7:
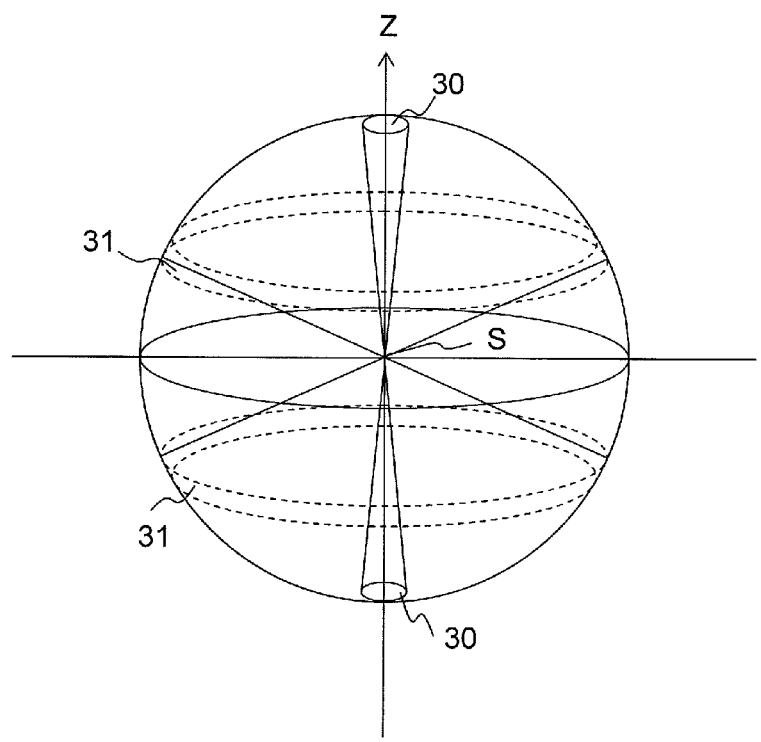

Now, again refer to FIG. 7 for description of the light extraction efficiency. FIG. 7 illustrates how much of light whose light amount is 1 in the transparent substrate 5 and which impinges on the minute portions 13A, 13B of the protection layer 11 at the incidence angle θ (the angle from the normal to the refracting surface) is emitted into the air 6 in the first light extraction. Here, the refractive index of the transparent substrate 5 is n1=1.457, the refractive index of the air 6 is n0=1.0, the wavelength of light is λ=0.635 μm, and the area proportion of the minute regions 13a is P=0.5. The width of the minute regions 13a, 13b, w, is a parameter (w=0.1, 0.2, 0.4, 1.0, 2.0, 20 μm).

Figure 18:
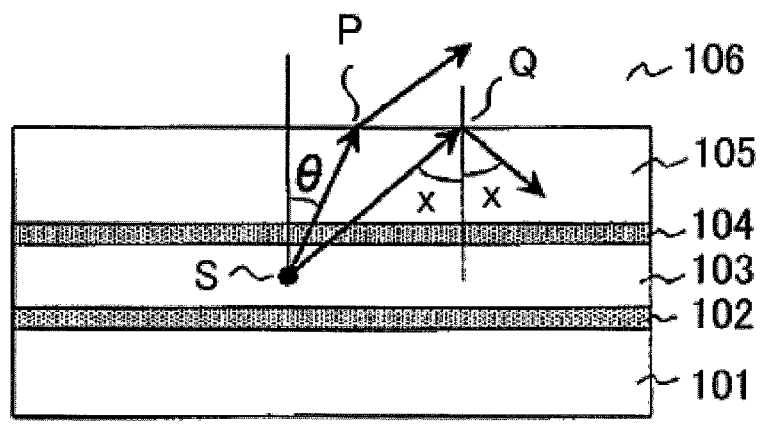
FIG. 18 shows a cross-sectional structure of an organic electroluminescence element of a conventional example and propagation of light.
Figure 19:
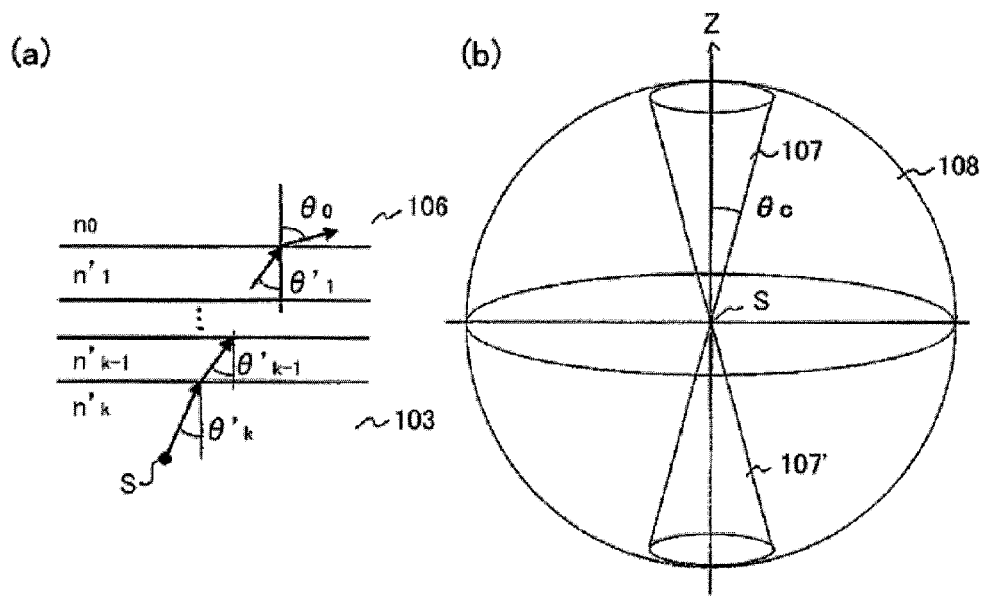
FIG. 19(a) shows a transparent substrate which has a multilayer structure.
FIG. 19(b) is a diagram illustrating the range of light which can be extracted.

It is seen that, in the present embodiment, as for small widths w (w=0.2, 0.4, 1.0, 2.0 (μm)), the transmittance is large due to the boundary diffraction effect even when the critical angle (43.34°) is exceeded. In this point, the present embodiment is different from the conventional light emitting device such as shown in FIG. 18.

Assuming that point light radiation occurs and light uniformly diffuses inside the transparent substrate 5 in the form of a spherical wave, the total amount of light in the range of the directional angle of radiation from θ (identical with the above-described incidence angle θ) to θ+dθ is proportional to sin θdθ. Therefore, the amount of extracted light is proportional to the transmittance t shown in FIG. 7 multiplied by sin θ. Thus, the incidence angle dependence of the amount of light extracted in the first light extraction can be determined by calculating how much of light whose light amount is 1 and which is radiated from a point in the transparent substrate 5 (in actuality, a point in the light emitting layer) and impinges on the minute portions 13A, 13B at the incidence angle θ (the angle from the normal to the refracting surface) is emitted into the air 6 in the first light extraction. Also, the incidence angle dependence of the amount of extracted light for the light which is once reflected by the protection layer 11 and then reflected by the electrode 2 to impinge on the protection layer 11 again, i.e., the incidence angle dependence of the amount of extracted light in the second light extraction, can be determined.

Figure 11:
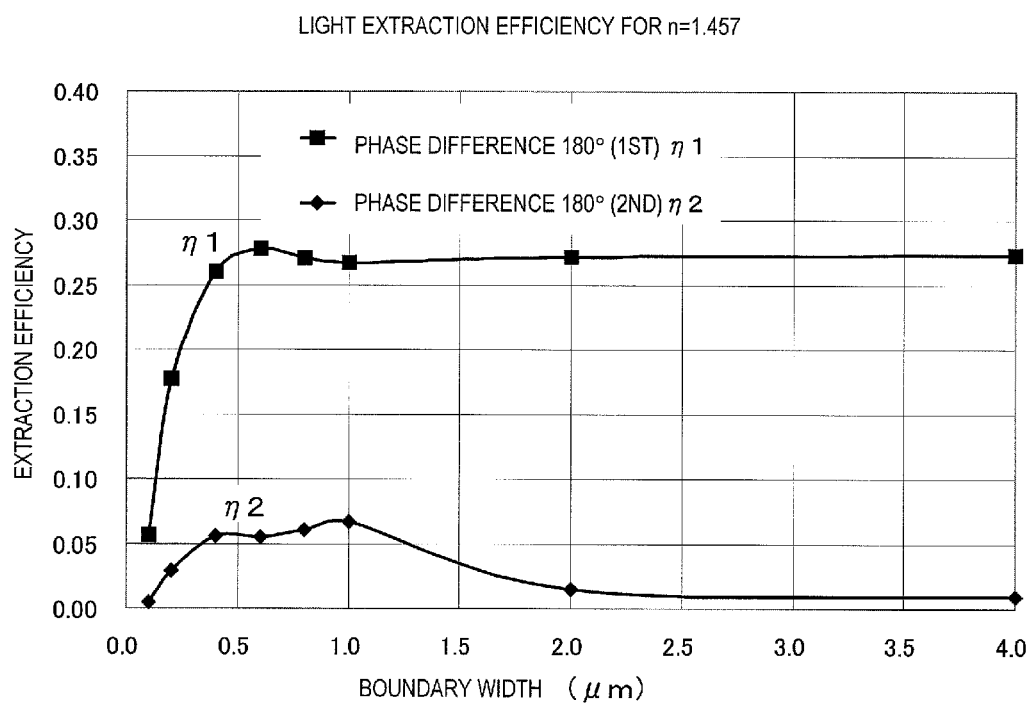
FIG. 11 illustrates the incidence angle dependence of the amount of extracted light in the protection layer of the first embodiment, specifically showing the incidence angle dependence of the amount of extracted light in the first light extraction and in the second light extraction.

Here, the light extraction efficiency is obtained by integrating the amount of extracted light by the incidence angle θ. FIG. 11 is a graph which illustrates the light extraction efficiency of the protection layer 11 of the first embodiment. FIG. 11 illustrates the light extraction efficiency for a case where phase shifters are placed in the minute regions 13a for converting the phase of light by 180°. FIG. 11 shows the results which were obtained under the same conditions as those of FIG. 7, with the abscissa axis representing the boundary width w of the protection layer 11. FIG. 11 shows not only the light extraction efficiency in the first light extraction, $\eta_1$, but also the light extraction efficiency in the second light extraction, $\eta_2$. The light extraction efficiency in the second light extraction, $\eta_2$, means the light extraction efficiency for light which is reflected by the protection layer 13 and then reflected by the electrode 2 to impinge on the protection layer 13 again on the assumption that attenuation of light during its to-andfro travel, such as absorption by the transparent electrode 4 and reflection loss at the electrode 2, would not occur. As the boundary width w increases, the light extraction efficiencies in the first light extraction and the second light extraction approximate to 0.25 and 0.00, respectively. As the boundary width w decreases from 0.3 μm, the light extraction efficiency becomes zero not only in the second light extraction but also in the first light extraction (for the reasons previously described with reference to FIG. 5(*e*)).

The light extraction efficiency in the second light extraction with consideration for attenuation of light during its to-and-fro travel between the transparent substrate 5 and the electrode 2 is $\tau \times \eta_2$ where $\tau$ is the transmittance of light during its to-and-fro travel between the transparent substrate 5 and the electrode 2 relative to the transparent substrate 5. Extraction of light is not limited to once or twice but is repeated endlessly. On the assumption that the relationship is a geometric progression where the light extraction efficiency in the first light extraction is $\eta_1$ and the light extraction efficiency in the second light extraction is $\tau \times \eta_2$, the light extraction efficiency for the $n^{th}$ light extraction is expected to be $\eta_1 \times (\tau \times \eta_2 / \eta_1)^{n-1}$. Thus, the total amount of extracted light up to the $n^{th}$ light extraction is represented by Formula 6 shown below.

$$\eta_1 \times \sum_{k=1}^{n} (\tau \times \eta_2 / \eta_1)^{k-1}$$ [Formula 6]

When n is infinite, it approaches to Formula 7 shown below.

$$\eta_1 / (1 - \tau \times \eta_2 / \eta_1)$$ [Formula 7]

In FIG. 11, as for the two curves, when w=0.20 μm, $\eta_1$=0.177 and $\eta_2$=0.029, and the light extraction efficiency obtained for $\tau$=0.88 is 0.207. When w=0.40 μm, $\eta_1$=0.260 and $\eta_2$=0.056, and the light extraction efficiency obtained is 0.321. When w=1.00 μm, $\eta_1$=0.267 and $\eta_2$=0.067, and the light extraction efficiency obtained is 0.343. When w=2.00 μm, $\eta_1$=0.271 and $\eta_2$=0.015, and the light extraction efficiency obtained is 0.284.

On the other hand, in the light emitting device shown in FIG. 18, since this can be considered as being equivalent to the case of w=∞, $\eta_1$=0.246 and $\eta_2$=0, and for the second and subsequent incidences, the efficiencies are all zero; thus, the total light transmittance is 0.246. Therefore, it is understood that, under the condition of w=0.20 μm, the light emitting device of the present embodiment achieves a light extraction efficiency that is 0.84 times that of the light emitting device shown in FIG. 18. Under the condition of w=0.40 μm, it achieves a light extraction efficiency that is 1.20 times that of the light emitting device shown in FIG. 18. Under the condition of w=1.00 μm, it achieves a light extraction efficiency that is 1.39 times that of the light emitting device shown in FIG. 18. Under the condition of w=2.00 μm, it achieves a light extraction efficiency that is 1.15 times that of the light emitting device shown in FIG. 18. As seen from FIG. 11, when w is from 0.3 μm to 2.00 μm, (generally, when the diameter of the largest inscribed circle of the minute regions 13 is from 0.3 μm to 2 μm), the light extraction efficiency can be greatly improved. When the protection layer 11 is fabricated such that w is 0.3 μm, w of the smallest region may be 0.2 μm due to the fabrication errors. In view of this result, w is preferably from 0.2 μm to 2 μm in order to improve the light extraction efficiency.

It is more preferred that w is from 0.4 μm to 0.8 μm because, in this case, the light extraction efficiency is maintained in a high range.

Next, the process of determining the proportions of the minute regions 13*a*, 13*b* is described. Table 1 shows the values of the light extraction efficiency which were calculated with the probability of the minute regions 13*a* among the minute regions 13, P1, as a parameter (the light extraction efficiency for the first light extraction, the light extraction efficiency for the second light extraction, and the total light extraction efficiency are represented by $\eta_1$, $\eta_2$, and $\eta$, respectively).

TABLE 1

| | P1 | | | | | | | | |
|---|---|---|---|---|---|---|---|---|---|
| | 0.0 | 0.1 | 0.2 | 0.4 | 0.5 | 0.6 | 0.7 | 0.8 | 0.9 |
| $\eta_1$ | 0.163 | 0.182 | 0.209 | 0.244 | 0.249 | 0.242 | 0.228 | 0.206 | 0.184 |
| $\eta_2$ | 0.059 | 0.100 | 0.121 | 0.132 | 0.136 | 0.127 | 0.121 | 0.112 | 0.096 |
| $\eta$ | 0.239 | 0.352 | 0.426 | 0.466 | 0.479 | 0.450 | 0.428 | 0.395 | 0.340 |

As shown in Table 1, the light extraction efficiency decreases as the value of P1 deviates from 0.5. The rate of the decrease is small in the range of $0.8 \geq P1 \geq 0.2$. Therefore, high light extraction efficiency is achieved so long as the present embodiment follows the pattern generation rule for the range of $0.8 \geq P1 \geq 0.2$.

The pattern of the polarizers 19*a*, 19*b* such as shown in FIG. 10 can be formed with the use of, for example, a patterned photonic crystal formation method. This is disclosed in, for example, *Periodical of the Japan Society for Precision Engineering, vol.* 74, book 8 (2008), pp. 795-798 (hereinafter, referred to as "Technical Document").

Hereinafter, an autocloning method in which layers of two types of materials are alternately formed is specifically described. First, in each square region in the base substrate, a striped pattern of trenches and ridges with the pitch of several hundreds of nanometers is formed by lithography. The stripe in a square in which the minute region 13*a* is to be formed and the stripe in a square in which the minute region 13*b* is to be formed extend in different directions.

Thereafter, a multilayer structure of about 20 cycles (40 layers) is formed on the base substrate by, for example, alternately supplying $SiO_2$ and $Ti_2O_5$. Here, the layers are formed while etching the surface with argon ion so that the formation of the multilayer structure can advance while forming slope surfaces in accordance with the trenches and ridges of the base substrate. After formation of the multilayer structure of 20 cycles, the thickness of this polarizer is about 0.5 μm. The difference in thickness between the portions in which the minute regions 13*a* are formed and the portions in which the minute regions 13*b* are formed is substantially zero.

The materials of the multilayer structure are not limited to the materials identified above but may be a combination of, for example, $SiO_2$ and $Si_3N_4$, $SiO_2$ and $TiO_2$, $SiO_2$ and $NbO_2$, $SiO_2$ and Si, or the like.

The above-identified Technical Document discloses that the size of the square region is about 5 μm×5 μm. In the lithography performed on the base substrate, a microprocessing technique, such as electron beam lithography, or the like, may be used. In this case, the processing can be performed in a region which is further smaller by one order of magnitude.

Next, a variation of the present embodiment is described.

Figure 12:
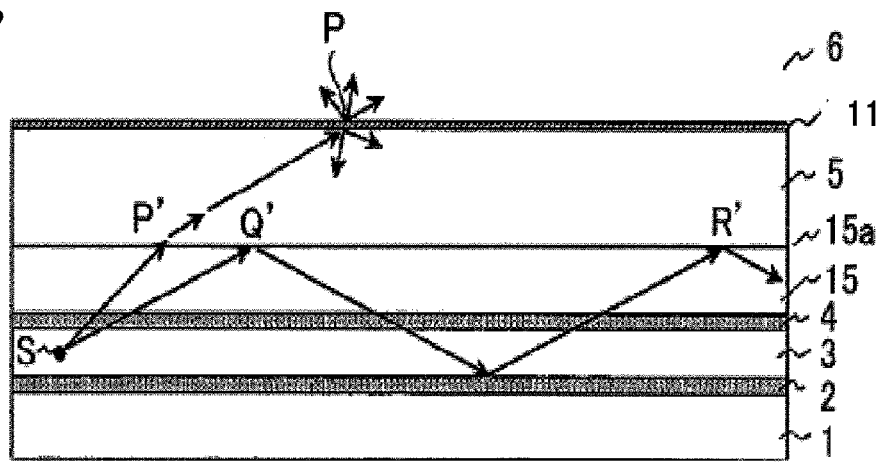
FIG. 12 is a cross-sectional view of an example of the light emitting device of the first embodiment (a light emitting device which includes an adjustment layer).

In some organic EL elements, as shown in FIG. 12, a transparent adjustment layer 15 may be provided on the transparent electrode 4 for adjusting the transmittance of light during its to-and-fro travel between the transparent substrate 5 and the electrode 2. In this case, the transparent substrate 5 is stacked on the adjustment layer 15 (i.e., an organic EL element which further includes the adjustment layer 15 may be referred to as "light emitting body"). When the refractive index $n_1$ of the transparent substrate 5 is smaller than the refractive index $n_1'$ of the adjustment layer 15, there is an interface 15a between the transparent substrate 5 and the adjustment layer 15 at which total reflection occurs. Especially when $n_1'-n_1>0.1$, the interface produces a nonnegligible effect.

Specifically, light radiated from the point S that is inside the light emitting layer 3 of the refractive index $n_2$ enters the transparent electrode 4 directly or after being reflected by the electrode 2 and is then transmitted therethrough. Then, the light is transmitted through the adjustment layer 15 of the refractive index $n_1'$ and refracted at point P' on an interface 15a. The refracted light is transmitted through the transparent substrate 5 of the refractive index $n_1$ to be emitted into the air 6 via point P on the protection layer 11. Here, $n_1' \geq n_2 > n_1 > 1.0$. Note that $n_1'$ may be smaller than $n_2$, but in such a case, total reflection occurs between the transparent electrode 4 and the adjustment layer 15. Since a surface of the transparent substrate 5 bordering on the air 6 has the protection layer 11 of the present embodiment, light that is incident at an angle greater than the critical angle can also be extracted to the air layer 6 side. However, due to the relationship of $n_1'>n_1$, total reflection also occurs on the interface 15a. Specifically, incidence of light at point Q' which occurs with a greater incidence angle than at point P' results in total reflection. This reflected light repeatedly undergoes total reflection between the interface 15a and the electrode 2 and therefore cannot be extracted to the air 6 side.

Figure 13:
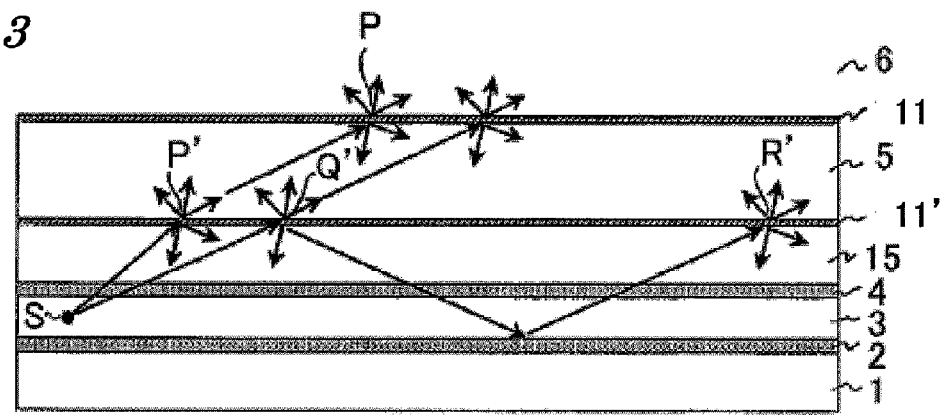
FIG. 13 is a cross-sectional view of another example of the light emitting device of the first embodiment (a light emitting device which has a surface structure in a surface bordering on the adjustment layer).

In such a case, as shown in FIG. 13, another protection layer 11' of the present embodiment is provided at the interface between the adjustment layer 15 and the transparent substrate 5. With this arrangement, light impinging on this surface at an incidence angle greater than the critical angle can be extracted to the air 6 side.

Specifically, due to the protection layer 11', incidence of light at point Q' at an angle greater than the critical angle does not result in occurrence of total reflection. A component of the light which is reflected by this surface is then reflected by the electrode 2 to again impinge on the protection layer 11' at point R'. Part of the impinging light can be emitted into the air 6 via the protection layer 13. This process is repeated endlessly. The configuration of FIG. 13 has complexity in forming two layers of the protection layers 11, 11' which have recessed portions and raised portions. However, the configuration of FIG. 13 is advantageous because a material of a low refractive index can be used for the transparent substrate 5, so that a wider selection of materials can be provided.

Note that, as seen from formula 7, as the transmittance $\tau$ of light during its to-and-fro travel between the transparent substrate 5 and the electrode 2 increases, the light extraction efficiency increases. In an actual device, the light emitting layer 3 is adjoined by a plurality of transparent layers, such as the above-described adjustment layer 15, as well as by the electrode 2 and the transparent electrode 4. The design of these films (the refractive index and the thickness of the films including the light emitting layer 3) is to be determined such that the above-described transmittance $\tau$ achieves the maximum value. In this case, reflection by the protection layer 13 results in a random phase distribution, and therefore, superposition of reflected light beams is considered as being incoherent (it is not addition of amplitudes but addition of intensities). Thus, the effects of the reflection by the surface of the transparent substrate 5 are negligible, and therefore, it can be assumed that the reflectance is 0% and the transmittance is 100%. The refractive index and the thickness of respective one of the films are determined so as to maximize the amount of light obtained by superimposition of complex amplitudes of light beams which are radiated from the transparent substrate 5 and repeatedly travel to-and-fro through a multilayer film including the light emitting layer 3 to return to the transparent substrate 5 under the above assumption.

As previously described, if equivalent emission of light (so called "boundary diffraction effect") occurs on the refracting surface, the light would propagate through both media on the opposite sides of the refracting surface irrespective of the incidence conditions on the refracting surface. The phenomenon illustrated in FIG. 7, in which light is transmitted through the refracting surface even if the critical angle is exceeded, can be explained based on the conditions which allow occurrence of equivalent radiation of light on this refracting surface.

(Second Embodiment)

Figure 14:
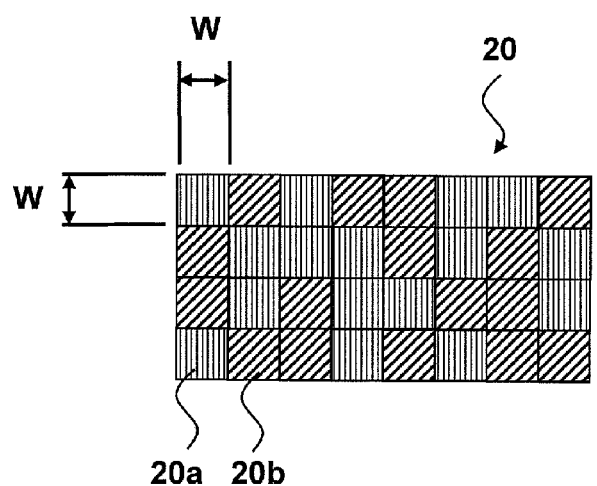
FIG. 14 shows a pattern of a protection layer of the second embodiment.

Hereinafter, the second embodiment of a sheet (protection layer) and a light emitting device according to the present invention is described with reference to FIG. 14. Note that the second embodiment is different from the first embodiment only in the pattern of the minute portions 13A, 13B in the protection layer 11. The other elements are all the same as those of the first embodiment. The descriptions of the elements which are common among the first and second embodiments are herein omitted.

The second embodiment has a two-dimensional waveplate array structure in which ½-wave plates 20a, 20b having different optical axes are provided in the minute portions 13A, 13B (FIG. 14), instead of the minute polarizers of the first embodiment which have generally-perpendicular transmission axes.

The wave plates 20a, 20b provided in the minute portions 13A, 13B are arranged such that the directions of their optical axes form an angle of generally 45°.

Here, the angle formed between the direction of oscillation of the electric field vector of linear polarization of incident light and the optical axis of one of the ½-wave plates is θ. The ½-wave plates have the function of rotating the polarization plane of incident light by 2θ. Therefore, the direction of oscillation of the electric field vector of emitted light deviates from the optical axis of the crystal by θ−2θ degrees, i.e., −θ degrees. Here, the optical axis of the other one of the ½-wave plates deviates from the direction of oscillation of the electric field vector of linear polarization of incident light by θ+45 degrees. The direction of oscillation of the electric field vector of emitted light deviates from the optical axis of the crystal by θ−2(θ+45) degrees, i.e., −θ−90 degrees. It is understood from this result that, in the case where light impinges on the ½-wave plates which are arranged such that their optical axes are in different directions by 45°, the polarization axes of light emitted from the respective wave plates are perpendicular to each other. In the present embodiment, an effect which is equivalent to the phase difference of π is obtained. Thus, the phase difference between the light emitted from the minute regions 13a and the light emitted from the minute regions 13b is π so that, between the light beams transmitted through the minute regions 13a, 13b, the phase of the electric field vector is discontinuous. Hence, the contour integral of the electric field vector of light impinging on the refracting surface is not zero, so that light is radiated at the boundary between the minute regions 13a and the minute regions 13b (boundary diffraction effect).

Here, comparison of the phases is made between light beams which have equal wavelengths, although light of different wavelengths are radiated from the organic EL element.

The protection layer 11 is designed such that the phase difference is π in terms of a wavelength around the middle of the wavelength range of visible light emitted from an organic EL element (generally from 380 nm to 780 nm), i.e., green or red light at a wavelength around 600 nm. However, among different wavelengths of light emitted from the organic EL element, any of the wavelengths may be selected as a reference in designing the protection layer 11. The reference wavelength may vary depending on the wavelength range of light emitted from the light emitting element. For example, light at 400 nm or 500 nm may be selected in designing the protection layer 11.

The extent of the meaning of the statement, "the phase difference between the light transmitted through the minute regions 13a and the light transmitted through the minute regions 13b is π," includes a case where the phase difference has a deviation from π due to manufacturing errors of the minute portions 13A, 13B and measurement errors in measurement of the direction of oscillation of the electric field vector of light.

Note that the wave plates can also be formed using the same formation method as that for the polarizer array of the first embodiment, with the thickness of the multilayer structure (the thicknesses of the respective layers and the cycles of formation of layers) being controlled. The capability of forming the wave plates using a formation method for patterned photonic crystal is disclosed in the Technical Document mentioned in the first embodiment.

Formation of the wave plates is specifically described below. First, in each of the square regions in the base substrate, a stripe pattern of trenches and ridges with the pitch of several hundreds of nanometers is formed by lithography. Here, the stripe in squares in which the minute regions 13a are to be formed and the stripe in squares in which the minute regions 13b are to be formed are in different directions by 45°.

Thereafter, a multilayer structure of about 10 cycles (20 layers) is formed on the base substrate by, for example, alternately supplying $SiO_2$ and $Ti_2O_5$. Here, the layers are formed while etching the surface with argon ion so that the formation of the multilayer structure can advance while forming slope surfaces in accordance with the trenches and ridges of the base substrate. After formation of the multilayer structure of 10 cycles, the thickness of this polarizer is about 3 μm. The difference in thickness between the portions in which the minute regions 13a are formed and the portions in which the minute regions 13b are formed is substantially zero. By sufficiently decreasing the thicknesses of the respective layers and the pitch for formation of layers of the multilayer structure relative to the wavelength of incident light, a difference in the effective refractive index occurs in terms of respective polarization components, so that the protection layer can have a function as a phase plate.

The above-identified Technical Document discloses that the size of the square region is about 5 μm×5 μm. In the lithography performed on the base substrate, a microprocessing technique, such as electron beam lithography, or the like, may be used. In this case, the processing can be performed in a region which is further smaller by one order of magnitude.

(Third Embodiment)

Figure 15:
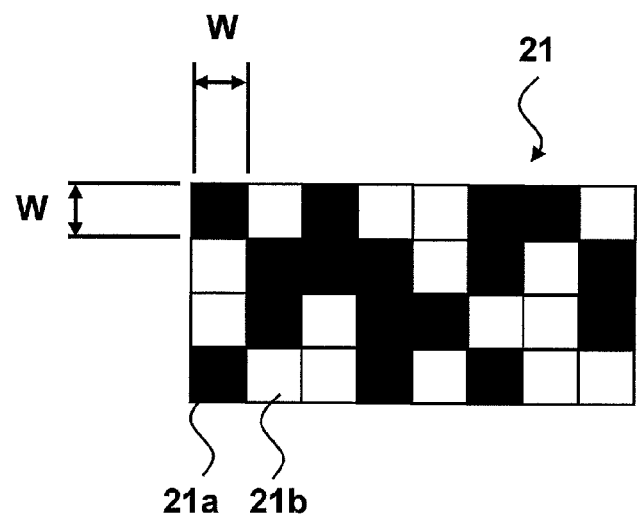
FIG. 15 shows a pattern of a protection layer of the third embodiment.

Hereinafter, the third embodiment of a sheet (protection layer) and a light emitting device according to the present invention is described with reference to FIG. 15. Note that the third embodiment is different from the first embodiment only in the pattern of the minute portions 13A, 13B in the protection layer 11. The other elements are all the same as those of the first embodiment. The descriptions of the elements which are common among the first and third embodiments are herein omitted.

The third embodiment has a two-dimensional array structure in which light-transmitting plates 21b and light-blocking plates 21a are arranged in the minute portions 13A and the minute portions 13B without leaving any gap therebetween (FIG. 15), instead of the minute polarizers of the first embodiment which have generally-perpendicular transmission axes.

In the present embodiment, light impinging on the light-blocking plates 21a is blocked so that, between the light beams transmitted through the minute regions 13a, 13b, the magnitude of the electric field vector is discontinuous. Hence, the contour integral of the electric field vector of light impinging on the refracting surface is not zero, so that light is radiated at the boundary between the minute regions 13a and the minute regions 13b (boundary diffraction effect). Thus, the present embodiment achieves a light extraction characteristic equivalent to that of the pinhole or phase shifters, i.e., a characteristic equivalent to that obtained when the phase difference of π is given between the minute portions 13A and the minute portions 13B.

The protection layer 11 of the present embodiment can be fabricated using a method which is described hereinbelow. For example, a metal layer on a glass substrate may be patterned by means of electron beam exposure and dry etching in the same way as in formation of a mask for use in photolithography. In this case, portions from which the metal layer is removed such that the glass substrate is exposed constitute the light-transmitting plates 21b, and portions in which the metal layer is remaining constitute the light-blocking plates 21a. The pattern size of 1 μm or smaller can be sufficiently formed.

(Fourth Embodiment)

Figure 16:
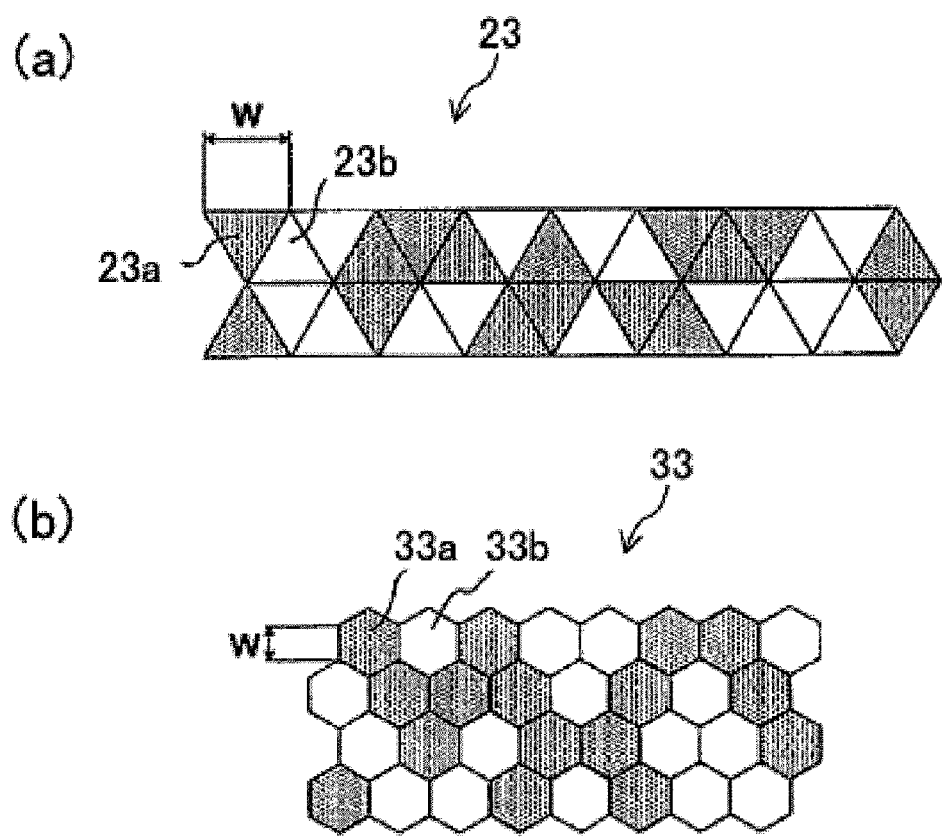
FIG. 16(a) shows the first pattern of the fourth embodiment.
FIG. 16(b) shows the second pattern of the fourth embodiment.

Hereinafter, the fourth embodiment of a sheet (protection layer) and a light emitting device according to the present invention is described with reference to FIG. 16. Note that the fourth embodiment is different from the first embodiment only in the pattern of the minute portions 13A, 13B in the protection layer 11. The other elements are all the same as those of the first embodiment. The descriptions of the elements which are common among the first and fourth embodiments are herein omitted.

FIG. 16(a) is a diagram which shows the pattern of a first protection layer 23 of the present embodiment. As shown in FIG. 16(a), the first protection layer 23 has a pattern which is obtained by dividing the surface into right triangles (minute regions 13) such that each side of the triangle has a length w, and randomly allocating α regions 23a (minute regions 13a) and β regions 23b (minute regions 13b) to respective ones of the minute regions 13 such that the proportion of the α regions 23a or the β regions 23b is 50%. Here, w is 3.5 μm or less.

FIG. 16(b) is a diagram which shows the pattern of a second protection layer 33 of the present embodiment. As shown in FIG. 16(b), the second protection layer 33 has a pattern which is obtained by dividing the surface into right hexagons (minute regions 13) such that each side of the hexagon has a length w, and randomly allocating α regions 33a (minute regions 13a) and β regions 33b (minute regions 13b) to respective ones of the hexagons such that the proportion of the α regions 33a or the β regions 33b is 50%. Here, w is 1.15 μm or less.

Generally speaking, the requirement for the size of the minute regions is that the largest one of the inscribed circles of the minute regions has a diameter of from 0.2 μm to 2 μm.

The protection layers 23, 33 of the present embodiment may be any of the polarizers such as described in the first embodiment, the wave plates such as described in the second embodiment, and the light-transmitting plates and light-blocking plates such as described in the third embodiment.

The shape of the pattern of the present embodiment is not limited to a right triangle or a right hexagon but may be any polygon so long as the surface can be divided into geometrically congruent polygonal regions without leaving any gap therebetween.

The fourth embodiment is different from the first embodiment only in the shape of the patterns of the protection layers 23 and 33. The fourth embodiment is however based on the same principles as those of the first embodiment and produces the same effects as those of the first embodiment.

Note that, in the formation of the protection layers of the first to fourth embodiments, the minute portions 13A, 13B in actually manufactured products may not strictly have a right square, right triangular, or right hexagonal shape. For example, a vertex of one polygonal minute region may be rounded, and a vertex of a minute region adjacent to the vertex-rounded region may be accordingly deformed. However, even in such a case, as a matter of course, the characteristics do not degrade, and the same effects can be achieved.

(Other Embodiments)

The above-described embodiments are merely examples of the present invention, and the present invention is not limited to these examples.

When the transparent substrate 5 has a large thickness, the position of light emission (planar position) occurs at more distant positions from the light radiation point S as the number of times of light extraction increases. If this applies to a device in which the structure is divided for respective ones of the pixels of about 300 μm, such as an EL element for display applications, light leaks into an adjacent pixel so that the image quality degrades. One possible solution for prevention of this problem is the structure shown in FIG. 17($a$) in which the transparent substrate 5 with the protection layer 13 has a small thickness of about several micrometers, and the substrate is covered with a protection substrate 14 of about 0.2 mm to 0.5 mm with an intervening air layer. The front surface 14$a$ and the rear surface 14$b$ of the protection substrate 14 need an AR coat, although total reflection does not occur on these surfaces. In this case, over the protection layer 13, the air layer may be replaced by a transparent material of a low refractive index, such as an aerogel or the like. This configuration provides an integral structure of the components, from the substrate 1 to the protection substrate 14, and therefore improves the device stability.

Figure 17:
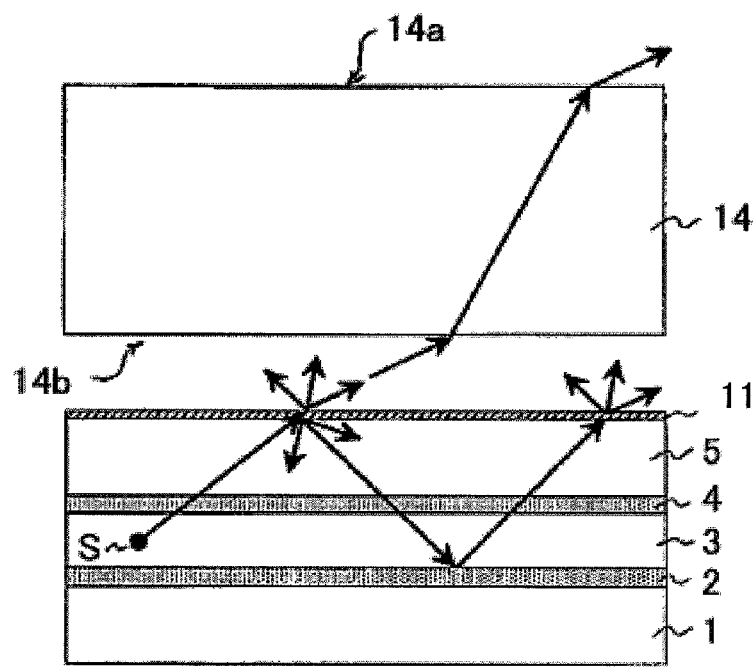
FIGS. 17(a) and 17(b) show cross-sectional structures of organic electroluminescence elements of other embodiments and propagation of light.
Figure 17:
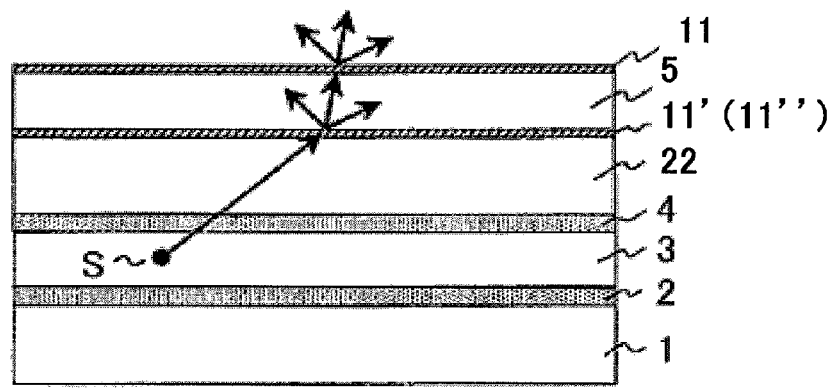

In the above embodiments, the protection layer 11 is only provided on one surface (upper surface) of the transparent substrate 5. However, like structures may be formed on the opposite surfaces of the transparent substrate 5. A common diffraction grating 11' may be provided between the protection layer 11 and the light radiation point S. In this case, as shown in FIG. 17($b$), the transparent substrate 5 has a film-like shape, with the protection layer 11 on the front surface and a film 11' with a diffraction grating or a film 11" with a surface structure of a modified configuration on the rear surface, and is adhered to the light emitting body side via an adhesive layer 22. When the refractive index of the transparent substrate 5 is small and the difference in refractive index between the transparent substrate 5 and the light emitting layer 3 is 0.1 or more, the material of the adhesive layer 22 may be selected from materials of refractive indices smaller than that of the light emitting layer 3 by 0.1 or more, so that total reflection scarcely occurs at the interface between the adhesive layer 22 and the light emitting layer 3. Total reflection which would occur at the refracting surface between the adhesive layer 22 and the transparent substrate 5 and total reflection which would occur at the refracting surface between the transparent substrate 5 and the air 6 can be avoided by the film 11" with a surface structure (or the film 11' with a diffraction grating) and the protection layer 11, respectively.

Note that the pattern of the protection layer 11 in the first to fourth embodiments are different from the surface state of frosted glass, surface roughening, or the like, or the surface state of a light emitting device described in Patent Document 2. The patterns of the protection layers of the first to fourth embodiments are obtained by dividing the surface into square regions of a chessboard-like grid such that each region has width w and allocating structures which form optically-discontinuous boundaries to the respective regions in the ratio of, for example, 1:1. This pattern has a specific scale, width w, and specific characteristics of the minute regions, and the ratio of the total area of the first group portions to the total area of the second group portions is 1:1.

By contrast, the surface state of frosted glass, surface roughening, or the like, does not have a specific width w (at least in the range of w≧0.05 μm), and the shape of the minute regions is indefinite. The area ratio is not 1:1.

Even when, in the first to fourth embodiments, the ratio of the regions is shifted from 50% so that the area ratio deviates from 1:1, there is still a specific width w, and the ratio between the total area of the first group portions and the total area of the second group portions has a predetermined value. This is clearly distinguishable from perfectly random patterns. Thus, the patterns of the above embodiments can be recognized as being a random pattern which is determined under a predetermined rule, rather than a perfectly-nonperiodic random pattern. Specifically, in the protection layer 11 of the first to fourth embodiments, the "two-dimensional arrangement of the minute regions $\delta_1$, $\delta_2$" is "nonperiodic". The size and shape of each of the minute regions $\delta$ are not in the category of "nonperiodic" features.

The phenomenon caused by the surface shapes of the first to fourth embodiments is a form of diffraction phenomenon. As shown in FIG. 2, in the diffraction phenomenon, a light ray resulting from virtual refraction relative to a flat reference plane which is equivalent to the average of the surface shape is referred to as a zeroth order diffraction component (which does not occur in the case of total reflection), and higher-order diffraction components occur in directions shifted from the zeroth order diffraction component which is used as a reference of the direction. In a random pattern of the present invention, the diffraction components other than the zeroth order occur in random propagation directions. By contrast, frosted glass and surface roughening cause a form of refraction phenomenon, which is different from the diffraction phenomenon. Across an uneven refracting surface, the direction of the normal to the refracting surface randomly varies, and accordingly, the direction of refraction also randomly varies. For example, when the pattern shape of one of the first to fourth embodiments is formed in one surface of a parallel flat plate, the contour of an image of an object on the opposite side of the plate can be clearly seen through the plate. This is because the light diffracted by the surface shape always includes a zeroth order diffraction component, and this component serves to maintain the contour of the image of the object on the opposite side of the plate. By contrast, in the case of frosted glass or surface roughening, the light does not include a component which is equivalent to the zeroth order diffraction component, so that the contour of the image of the object on the opposite side appears blurred when seen through the plate. Patent Document 2 only describes that light is "obediently emitted into the air" by means of projections formed in the surface but fails to mention the term "diffraction." Generally, the word "obediently" can be interpreted as "being obedient to Snell's law (law of refraction) that is a simpler principle." In this context, the surface protrusions of Patent Document 2 are recognized as being in the same category as frosted glass and surface roughening and thus can be said to be different from the present invention.

The technical feature disclosed in Patent Document 2 is to perfectly randomly arrange a plurality of transparent projections over a transparent insulative substrate. Patent Document 2 fails to disclose or suggest the feature of the present invention that respective regions are treated as one or more groups of minute regions having the same shape and the ratio between the respective regions is set to a specific value. For example, in the present invention, a structure in which the first group regions and the second group regions are exchanged is substantially the same as the original structure. This is not the case with the light emitting device of Patent Document 2. The present inventors are the first to find that the features of the present invention achieve excellent light extraction effects, whereas Patent Document 2 fails to describe such excellent effects as obtained in the present invention.

The boundary diffraction effect occurs at a boundary where the direction, phase, or magnitude of the electric field vector of light is discontinuous. To maximize this effect, it is preferred to locally maximize the proportion of the boundaries where the direction, phase, or magnitude of the electric field vector of light is discontinuous. When the refracting surface is divided into an infinite number of minute regions such that the direction, phase, or magnitude of the electric field vector of light is discontinuous at the boundaries between the minute regions, the aforementioned proportion is locally maximized under the following two conditions. The first one is that the areas of the minute regions are as equal as possible. The second one is that there is a boundary where the direction, phase, or magnitude of the electric field vector of light is discontinuous between adjacent minute regions. Specifically, if one of the minute regions is larger than the others, the number of boundaries where the direction, phase, or magnitude of the electric field vector of light is discontinuous is increased by dividing this large minute region. If one of the minute regions is smaller than the others, this means that another one of them is larger than the others, and the number of boundaries where the direction, phase, or magnitude of the electric field vector of light is discontinuous is increased by dividing this large minute region. According to an extension of this logic, the proportion of the boundaries between the minute regions can be locally maximized under the conditions that the areas of the minute regions are as equal as possible, and that each of the areas of the minute regions is at least from 0.5 times to 1.5 times a predetermined reference area (the diameter of the largest one of the inscribed circles of the minute regions is from 0.7 times to 1.3 times a predetermined reference diameter). The first to fourth embodiments meet these conditions. Even when the division into the minute regions is locally maximized, the achieved effect decreases if the direction, phase, or magnitude of the electric field vector of light is equal between adjacent minute regions. Therefore, random allocation of minute regions is required such that there is a boundary between adjacent minute regions where the direction, phase, or magnitude of the electric field vector of light is discontinuous. In other words, the light emitting devices of the above embodiments do not realize improvements in the extraction efficiency by the antireflection effect of the light emitting device such as described in Patent Document 2 (although this effect is produced), but by the effect of local maximization of the boundary diffraction effect.

Parts of the first to fourth embodiments may be combined into a new example instead of independently enabling respective one of these embodiments. Although the first to fourth embodiments have been described with the examples of the organic electroluminescence element, the present invention is applicable to any element which is capable of emitting light in a medium whose refractive index is greater than 1. For example, the present embodiments are applicable to an LED, a light guide plate, and the like. The medium into which the light emitting device emits light is not limited to the air. The present invention is applicable to a transparent substrate whose refractive index is greater than that of a medium with which the transparent substrate is in contact, specifically greater than that of the medium by 0.1 or more.

INDUSTRIAL APPLICABILITY

As described above, a light emitting device of the present invention has a greatly-improved light extraction efficiency and is therefore useful for displays, light sources, etc.

REFERENCE SIGNS LIST 1 substrate
2 electrode
3 light emitting layer
4 transparent electrode
5 transparent substrate
6 air
11 protection layer
13$a$, 13$b$ minute region
13A, 13B minute portion
19$a$, 19$b$ polarizer
20$a$, 20$b$ ½-wave plate
21$a$ light-transmitting plate
21$b$ light-blocking plate
23$a$, 33$a$ α region
23$b$, 33$b$ β region
S light radiation point

The invention claimed is:

1. A light emitting device, comprising a light emitting body and a protection layer provided on a light emitting surface of the light emitting body,
wherein one of surfaces of the protection layer opposite to the light emitting surface includes a plurality of minute regions δ, a largest inscribed circle of the minute regions δ having a diameter from 0.2 μm to 2 μm,
each of the plurality of minute regions δ is adjoined by and surrounded by some other ones of the plurality of minute regions δ,
the plurality of minute regions δ include a plurality of minute regions $δ_1$ which are randomly selected from the plurality of minute regions δ so as to constitute 20% to 80% of the minute regions δ and a plurality of minute regions $δ_2$ which constitute the remaining portion of the minute regions δ,
light transmitted through the plurality of minute regions $δ_1$ and light transmitted through the plurality of minute regions $δ_2$ have a phase difference of π, and
the surface of the protection layer opposite to the light emitting surface borders on a medium which has a lower refractive index than a refractive index of the protection layer.

2. The light emitting device of claim 1, further comprising:
a plurality of minute portions d1 which include respective ones of the plurality of minute regions $δ_1$ and which extend in the thickness direction; and a plurality of minute portions d2 which include respective ones of the plurality of minute regions $\delta_2$ and which extend in the thickness direction, wherein the plurality of minute portions d1 include ½-wave plates which have identical optical axes, and the plurality of minute portions d2 include ½-wave plates which have identical optical axes, and a direction of the optical axes of the ½-wave plates of the plurality of minute portions d1 and a direction of the optical axes of the ½-wave plates of the plurality of minute portions d2 are arranged to form an angle of 45°.

3. The light emitting device of claim 1, wherein the medium is air.

4. The light emitting device of claim 1, wherein the medium is aerogel.

5. A light emitting device, comprising a light emitting body and a protection layer provided on a light emitting surface of the light emitting body, wherein one of surfaces of the protection layer opposite to the light emitting surface includes a plurality of minute regions $\delta$, a largest inscribed circle of the minute regions $\delta$ having a diameter from 0.2 µm to 2 µm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, the surface of the protection layer opposite to the light emitting surface borders on a medium which has a lower refractive index than a refractive index of the protection layer, the light emitting device further comprises a plurality of minute portions d1 which include respective ones of the plurality of minute regions $\delta_1$ and which extend in the thickness direction, and a plurality of minute portions d2 which include respective ones of the plurality of minute regions $\delta_2$ and which extend in the thickness direction, the plurality of minute portions d1 include polarizers which have identical transmission axes, and the plurality of minute portions d2 include polarizers which have identical transmission axes, and the transmission axes of the polarizers included in the plurality of minute portions d1 are perpendicular to the transmission axes of the polarizers included in the plurality of minute portions d2.

6. The light emitting device of claim 5, wherein the medium is air.

7. The light emitting device of claim 5, wherein the medium is aerogel.

8. A light emitting device, comprising a light emitting body and a protection layer provided on a light emitting surface of the light emitting body, wherein one of surfaces of the protection layer opposite to the light emitting surface includes a plurality of minute regions $\delta$, a largest inscribed circle of the minute regions $\delta$ having a diameter from 0.2 µm to 2 µm, each of the plurality of minute regions $\delta$ is adjoined by and surrounded by some other ones of the plurality of minute regions $\delta$, the plurality of minute regions $\delta$ include a plurality of minute regions $\delta_1$ which are randomly selected from the plurality of minute regions $\delta$ so as to constitute 20% to 80% of the minute regions $\delta$ and a plurality of minute regions $\delta_2$ which constitute the remaining portion of the minute regions $\delta$, the surface of the protection layer opposite to the light emitting surface borders on a medium which has a lower refractive index than a refractive index of the protection layer, the light emitting device further comprises a plurality of minute portions d1 which include respective ones of the plurality of minute regions $\delta_1$ and which extend in the thickness direction, and a plurality of minute portions d2 which include respective ones of the plurality of minute regions $\delta_2$ and which extend in the thickness direction, and either of the plurality of minute portions d1 or the plurality of minute portions d2 have light-blocking surfaces.

9. The light emitting device of claim 8, wherein the medium is air.

10. The light emitting device of claim 8, wherein the medium is aerogel.

* * * * *

UNITED STATES PATENT AND TRADEMARK OFFICE
CERTIFICATE OF CORRECTION

| | | |
|---|---|---|
| PATENT NO. | : 8,227,966 B2 | Page 1 of 1 |
| APPLICATION NO. | : 13/057297 | |
| DATED | : July 24, 2012 | |
| INVENTOR(S) | : Shin-ichi Wakabayashi, Seiji Nishiwaki and Masa-aki Suzuki | |

It is certified that error appears in the above-identified patent and that said Letters Patent is hereby corrected as shown below:

Title Page 2, item [56] under FOREIGN PATENT DOCUMENTS,
-- JP 2005-276581   10/2005 -- should be added.

Signed and Sealed this
Twenty-sixth Day of February, 2013

Teresa Stanek Rea
*Acting Director of the United States Patent and Trademark Office*